US012641924B2

(12) United States Patent
Ishizaki

(10) Patent No.: US 12,641,924 B2
(45) Date of Patent: May 26, 2026

(54) BONDED SEMICONDUCTOR DEVICE AND METHOD FOR MANUFACTURING BONDED SEMICONDUCTOR DEVICE

(71) Applicant: SHIN-ETSU HANDOTAI CO., LTD., Tokyo (JP)

(72) Inventor: Junya Ishizaki, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 539 days.

(21) Appl. No.: 17/928,307

(22) PCT Filed: Jun. 8, 2021

(86) PCT No.: PCT/JP2021/021656
§ 371 (c)(1),
(2) Date: Nov. 29, 2022

(87) PCT Pub. No.: WO2022/004293
PCT Pub. Date: Jan. 6, 2022

(65) Prior Publication Data
US 2023/0215976 A1      Jul. 6, 2023

(30) Foreign Application Priority Data

Jul. 3, 2020    (JP) ................................. 2020-115608

(51) Int. Cl.
*H10H 20/82*        (2025.01)
*H10F 71/00*        (2025.01)
(Continued)

(52) U.S. Cl.
CPC ......... *H10H 20/82* (2025.01); *H10F 71/1272* (2025.01); *H10F 71/1276* (2025.01);
(Continued)

(58) Field of Classification Search
CPC ...... H10H 20/82; H10H 20/018; H10H 20/84; H10H 20/854; H10H 20/872;
(Continued)

(56) References Cited

U.S. PATENT DOCUMENTS 6,072,227 A       6/2000  Yau et al.
7,960,246 B2 *    6/2011  Flamand ................ B64G 1/443
                                          257/E21.567

(Continued)

FOREIGN PATENT DOCUMENTS

CN        102655199 A  *   9/2012
CN        110581201 A     12/2019
(Continued)

OTHER PUBLICATIONS

Nov. 20, 2024 Office Action issued in Taiwanese Patent Application No. 110122007.

(Continued)

*Primary Examiner* — Earl N Taylor
(74) *Attorney, Agent, or Firm* — Oliff PLC

(57)        ABSTRACT
A bonded semiconductor device including an epitaxial layer, and a support substrate made of a material different from that of the epitaxial layer and bonded to the epitaxial layer. Any one of the epitaxial layer and the support substrate has a bonding surface with a radial pattern including recesses or protrusions radially spreading from a certain point on the bonding surface as a center.

20 Claims, 11 Drawing Sheets

(51) Int. Cl.

| | |
|---|---|
| *H10F 77/70* | (2025.01) |
| *H10H 20/01* | (2025.01) |
| *H10H 20/80* | (2025.01) |
| *H10H 20/84* | (2025.01) |
| *H10H 20/854* | (2025.01) |
| *H10P 10/00* | (2026.01) |
| *H10P 50/64* | (2026.01) |

(52) U.S. Cl.
    CPC ......... *H10F 77/703* (2025.01); *H10F 77/707* (2025.01); *H10H 20/018* (2025.01); *H10H 20/84* (2025.01); *H10H 20/854* (2025.01); *H10P 10/126* (2026.01); *H10H 20/872* (2025.01); *H10P 50/646* (2026.01)

(58) Field of Classification Search
    CPC ........... H10H 20/8582; H10H 20/0133; H10H 20/819; H10F 71/1272; H10F 71/1276; H10F 77/703; H10F 77/707; H10F 71/1395; H10D 30/4735; H10D 30/015; H10D 64/256; H01L 21/185; H01L 21/30612; H01L 21/78; H01L 21/7806; Y02P 70/50
    See application file for complete search history.

(56) References Cited

U.S. PATENT DOCUMENTS

| | | | | |
|---|---|---|---|---|
| 8,916,899 | B2 * | 12/2014 | Won | H10H 20/8585 438/30 |
| 12,010,866 | B2 * | 6/2024 | Lee | H10K 59/124 |
| 2003/0164505 | A1 * | 9/2003 | Streubel | H01L 23/3672 257/E23.103 |
| 2005/0272222 | A1 * | 12/2005 | Flamand | H01L 21/2007 438/459 |
| 2006/0163595 | A1 * | 7/2006 | Hsieh | H10H 20/82 257/E33.074 |
| 2007/0257269 | A1 * | 11/2007 | Cho | H10H 20/856 257/E33.068 |
| 2011/0207299 | A1 | 8/2011 | Sakurai | |
| 2011/0226319 | A1 * | 9/2011 | Soderstrom | H10F 77/70 257/E31.13 |
| 2012/0273043 | A1 * | 11/2012 | Lochtefeld | H10F 71/127 438/57 |
| 2013/0146131 | A1 | 6/2013 | Cuony et al. | |
| 2013/0222770 | A1 * | 8/2013 | Tomiyama | G03B 21/14 362/19 |
| 2014/0077224 | A1 * | 3/2014 | Li | H01S 5/0207 257/77 |
| 2017/0341600 | A1 * | 11/2017 | Kannzaki | B29C 37/0053 |
| 2020/0126932 | A1 | 4/2020 | Kim et al. | |
| 2021/0020814 | A1 | 1/2021 | Koshika et al. | |
| 2021/0151715 | A1 * | 5/2021 | Lee | H10K 59/124 |
| 2021/0226078 | A1 * | 7/2021 | Derkacs | H10F 77/124 |
| 2023/0215976 | A1 | 7/2023 | Ishizaki | |

FOREIGN PATENT DOCUMENTS

| | | | | | |
|---|---|---|---|---|---|
| JP | H07-130283 | A | | 5/1995 | |
| JP | H08-162664 | A | | 6/1996 | |
| JP | H09-063951 | A | | 3/1997 | |
| JP | 2001-102668 | A | | 4/2001 | |
| JP | 2002-033475 | A | | 1/2002 | |
| JP | 2006-210916 | A | | 8/2006 | |
| JP | 2007095855 | A | * | 4/2007 | ............ H01L 24/32 |
| JP | 2008066554 | A | * | 3/2008 | .......... H10H 20/816 |
| JP | 2009156781 | A | * | 7/2009 | .............. G01T 1/20 |
| JP | 2010-114203 | A | | 5/2010 | |
| JP | 2010192645 | A | * | 9/2010 | ............ H10H 20/82 |
| JP | 2011159657 | A | * | 8/2011 | |
| JP | 2012-146806 | A | | 8/2012 | |
| JP | 5008308 | B2 | | 8/2012 | |
| JP | 2013120824 | A | * | 6/2013 | ............ H01L 24/27 |
| JP | 2014-512699 | A | | 5/2014 | |
| JP | 2017-228569 | A | | 12/2017 | |
| JP | 2018-018920 | A | | 2/2018 | |
| JP | 2019-186539 | A | | 10/2019 | |
| KR | 20070117336 | A | * | 12/2007 | |
| KR | 20080023116 | A | * | 3/2008 | .......... H10H 20/816 |
| KR | 10-2013-0059228 | A | | 6/2013 | |
| KR | 20170142688 | A | * | 12/2017 | .......... G02B 6/0025 |
| WO | 2019102738 | A1 | | 5/2019 | |

OTHER PUBLICATIONS

Aug. 29, 2023 Office Action issued in Japanese Patent Application No. 2020-115608.

Jun. 28, 2024 Extended Search Report issued in European Patent Application No. 21834367.1.

Jan. 31, 2023 Office Action issued in Japanese Patent Application No. 2020-115665.

May 23, 2023 Office Action issued in Japanese Patent Application No. 2020-115665.

Feb. 11, 2025 Office Action issued in Taiwanese Patent Application No. 110122006.

Apr. 7, 2025 Office Action issued in U.S. Appl. No. 17/928,308.

May 30, 2023 Office Action issued in Japanese Patent Application No. 2020-115608.

Sep. 17, 2024 Extended European Search Report issued in European Patent Application No. 21834175.8.

Aug. 24, 2021 Search Report issued in International Patent Application No. PCT/JP2021/021655.

Dec. 13, 2022 International Preliminary Report on Patentability issued in International Patent Application No. PCT/JP2021/021655.

Aug. 24, 2021 Search Report issued in International Patent Application No. PCT/JP2021/021656.

Dec. 13, 2022 International Preliminary Report on Patentability issued in International Patent Application No. PCT/JP2021/021656.

U.S. Appl. No. 17/928,308, filed Nov. 29, 2022 on behalf of Junya Ishizaki.

Jul. 22, 2025 Notice of Allowance issued in U.S. Appl. No. 17/928,308.

* cited by examiner

[FIG. 1]
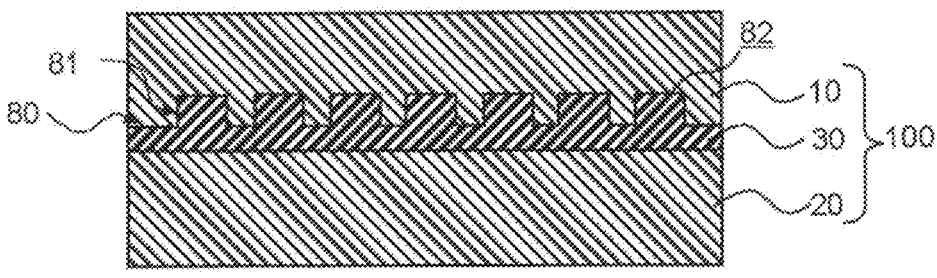
[FIG. 2]
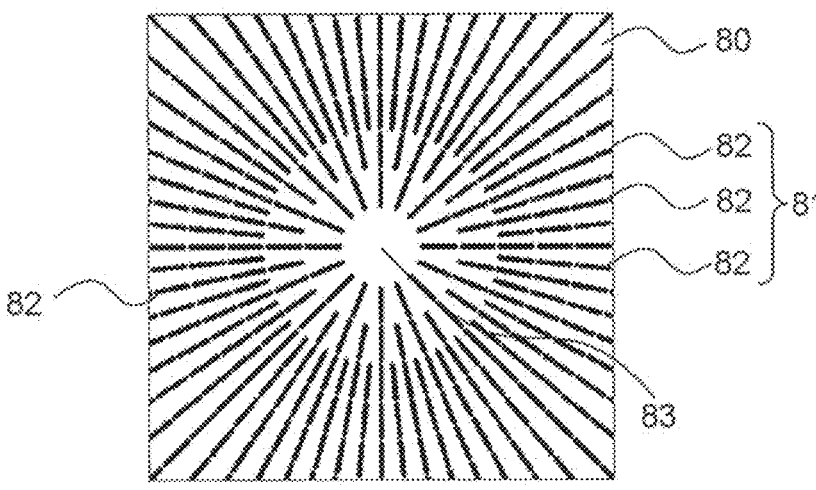
[FIG. 3]
(A)
 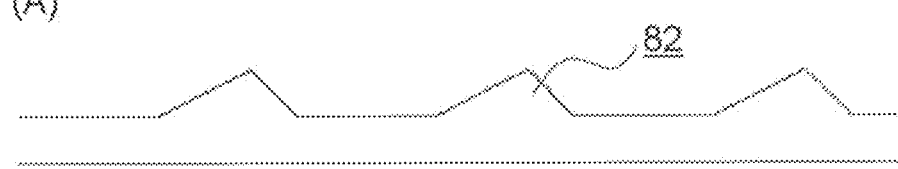
(B)
 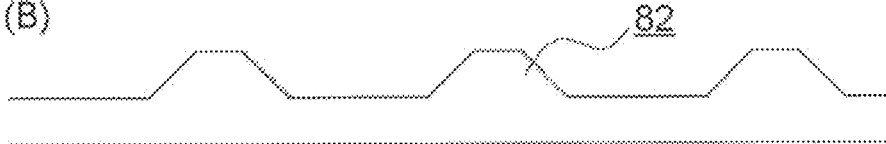
(C)
 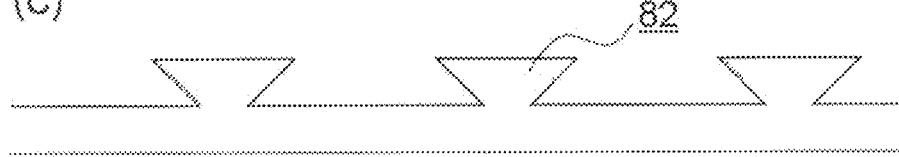

[FIG. 4]
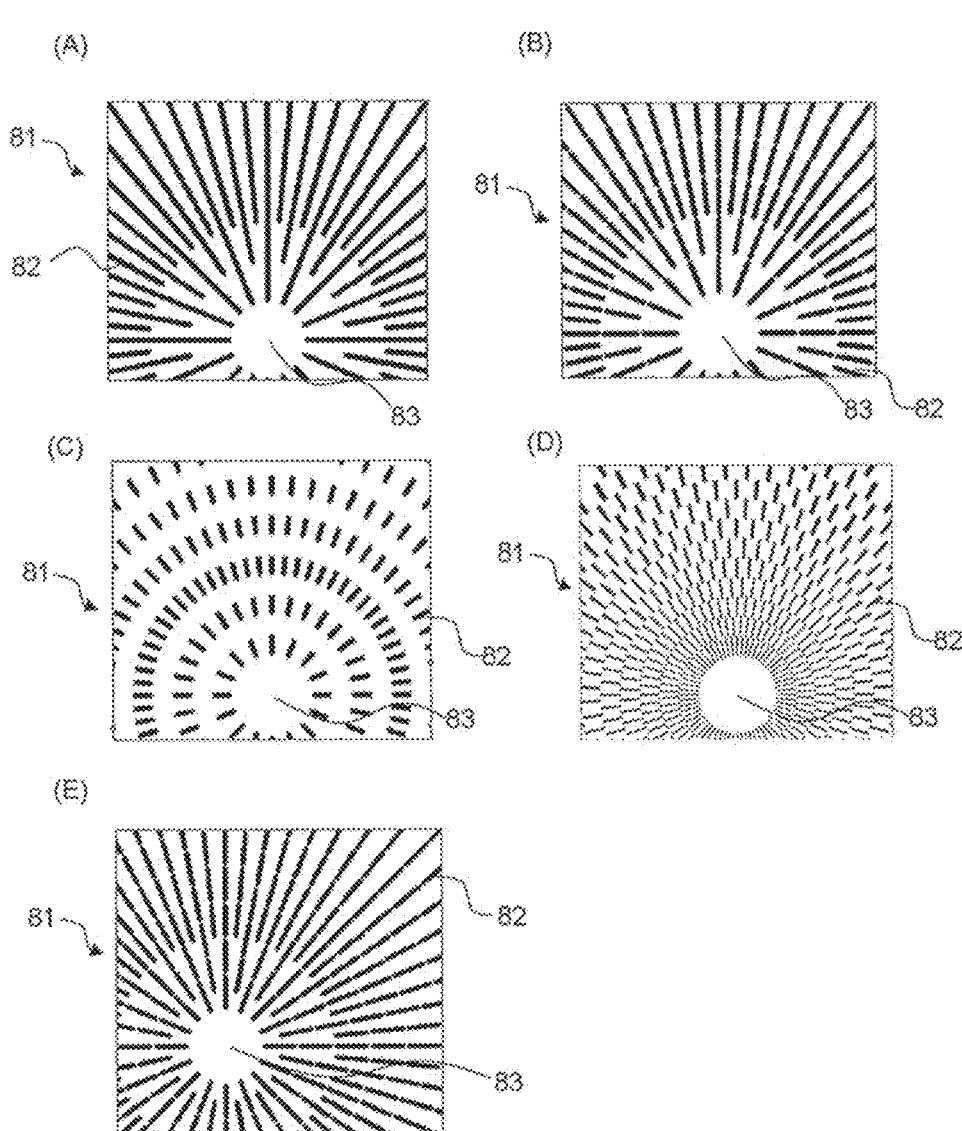
(A)       (B)
(C)       (D)
(E)
[FIG. 5]
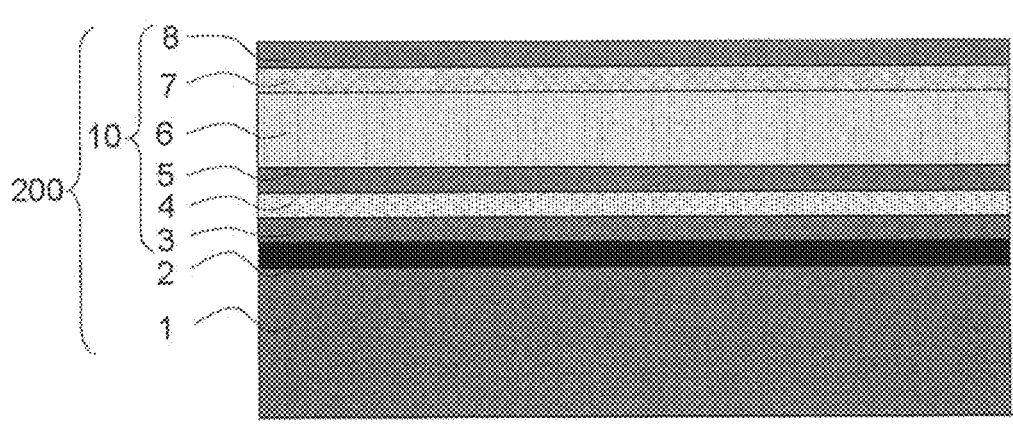

[FIG. 6]
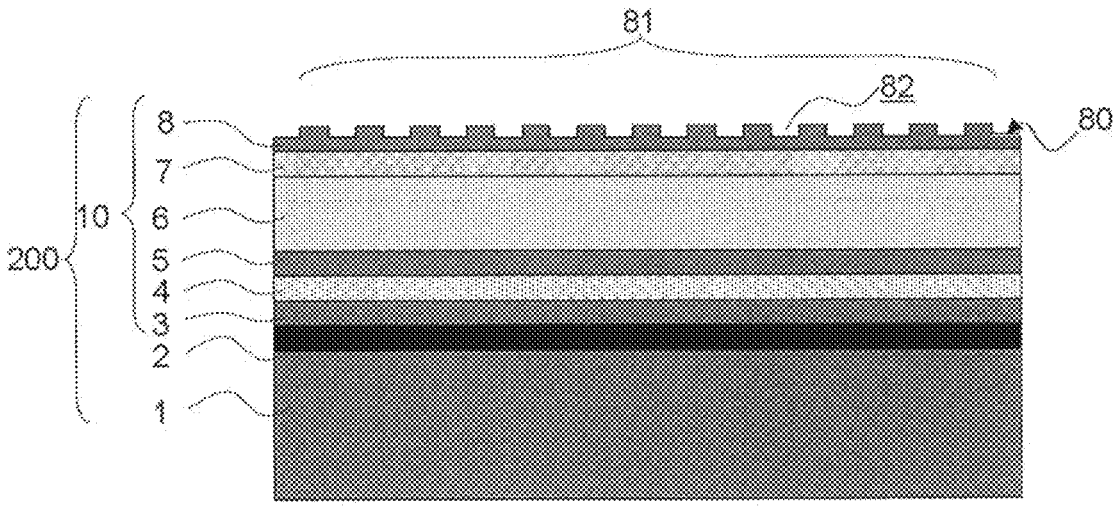
[FIG. 7]
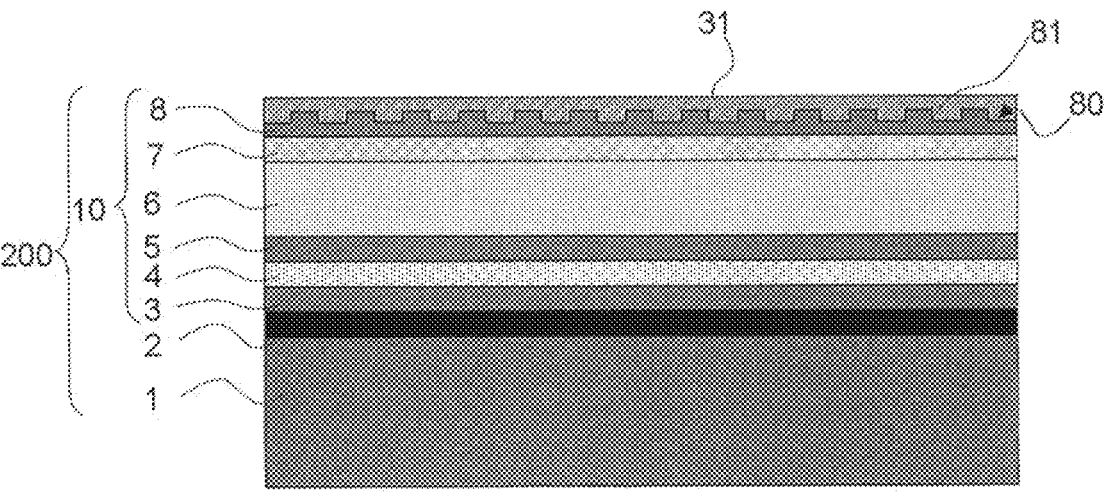
[FIG. 8]

[FIG. 9]
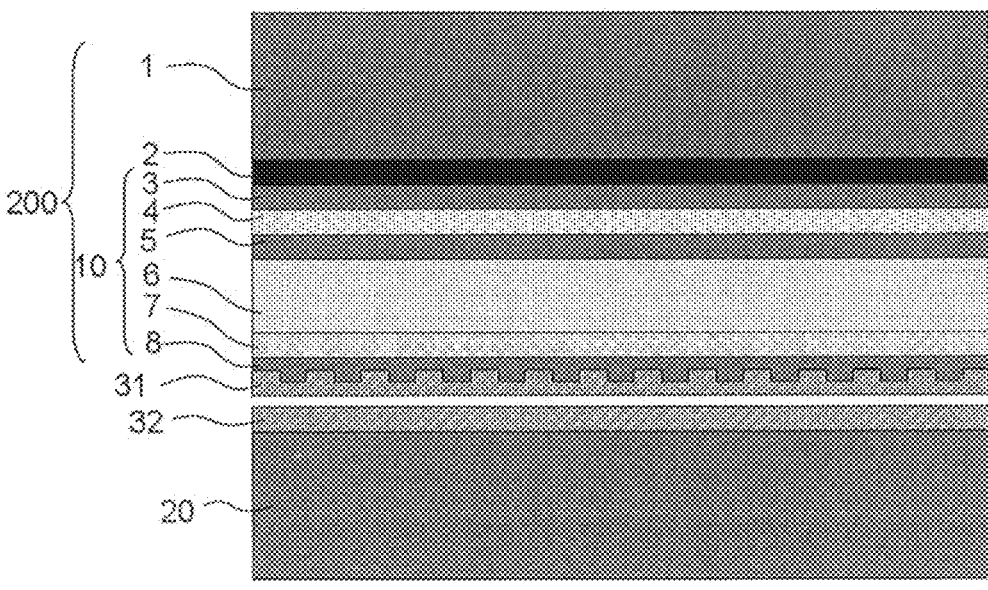
[FIG. 10]
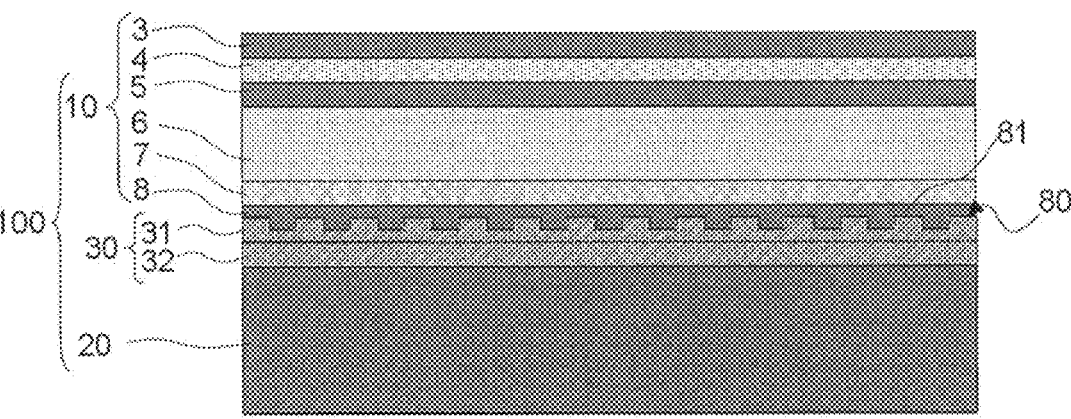
[FIG. 11]
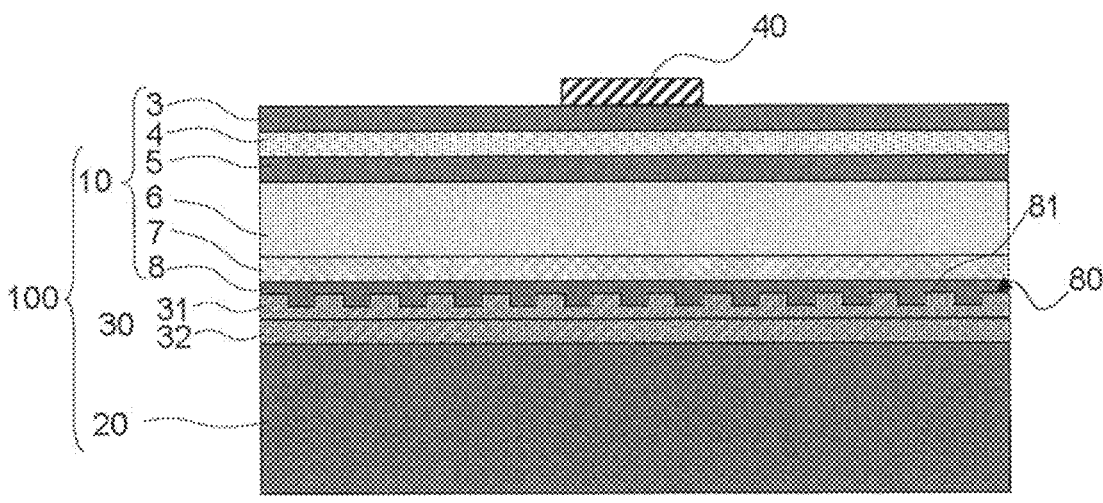

[FIG. 12]
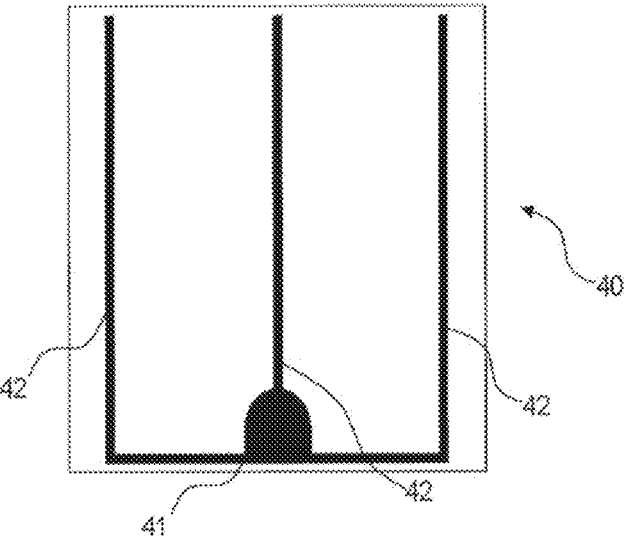
[FIG. 13]
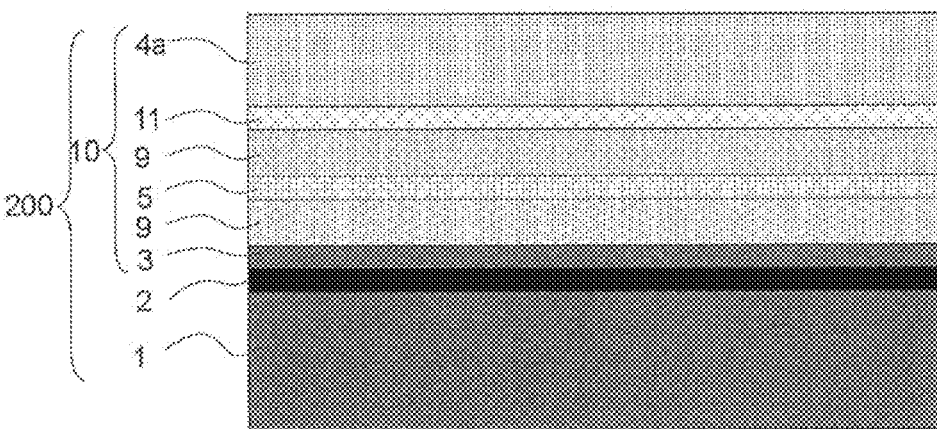
[FIG. 14]
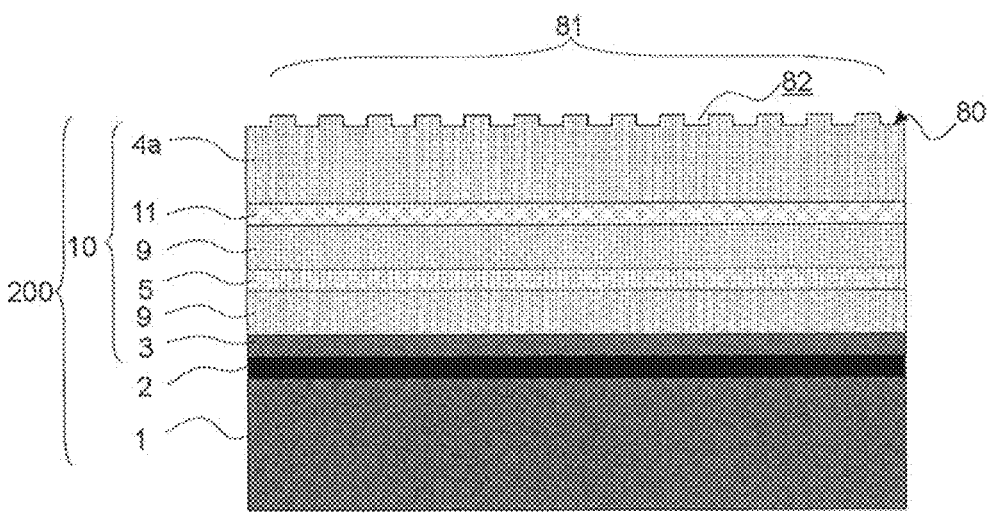

[FIG. 15]
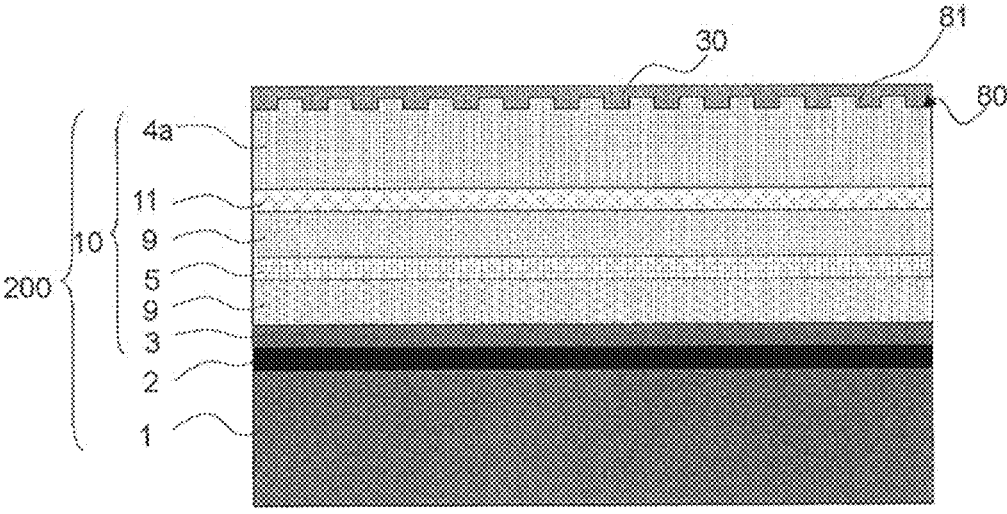
[FIG. 16]
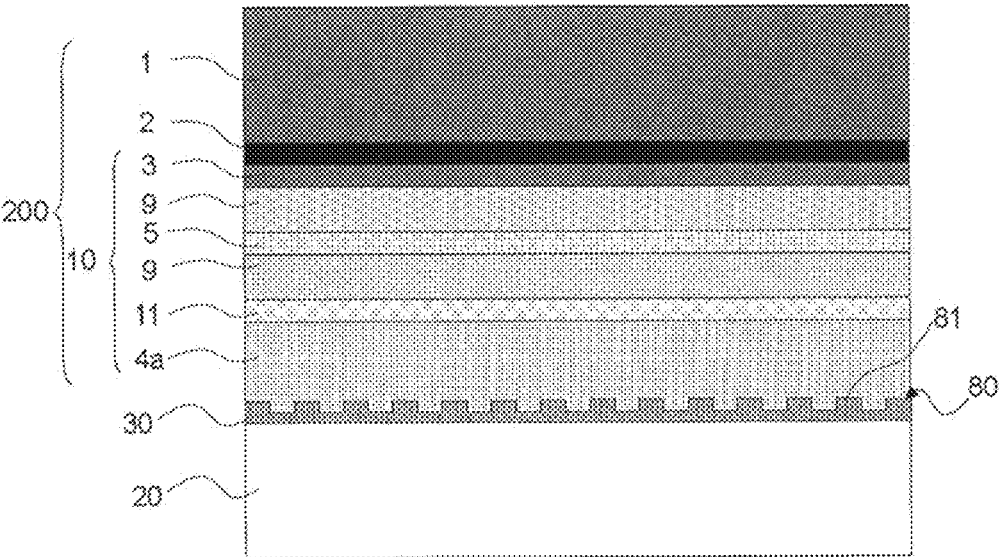
[FIG. 17]
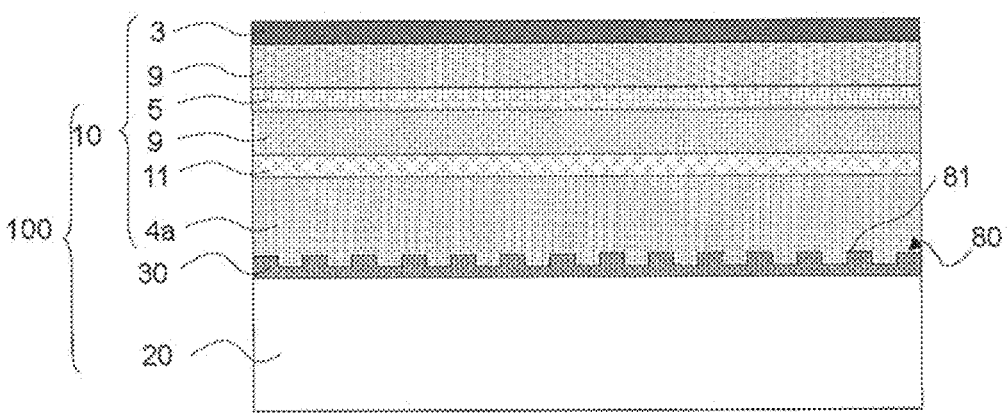

[FIG. 18]
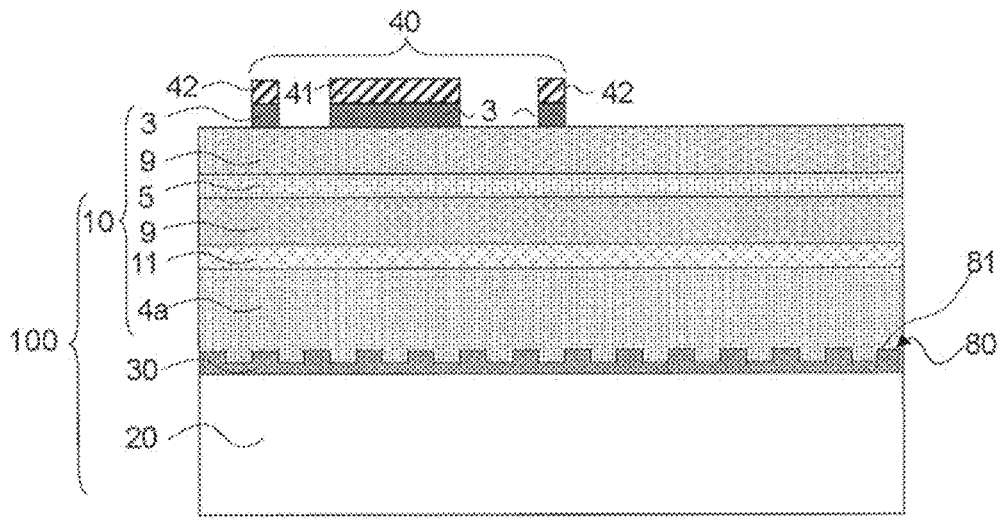
[FIG. 19]
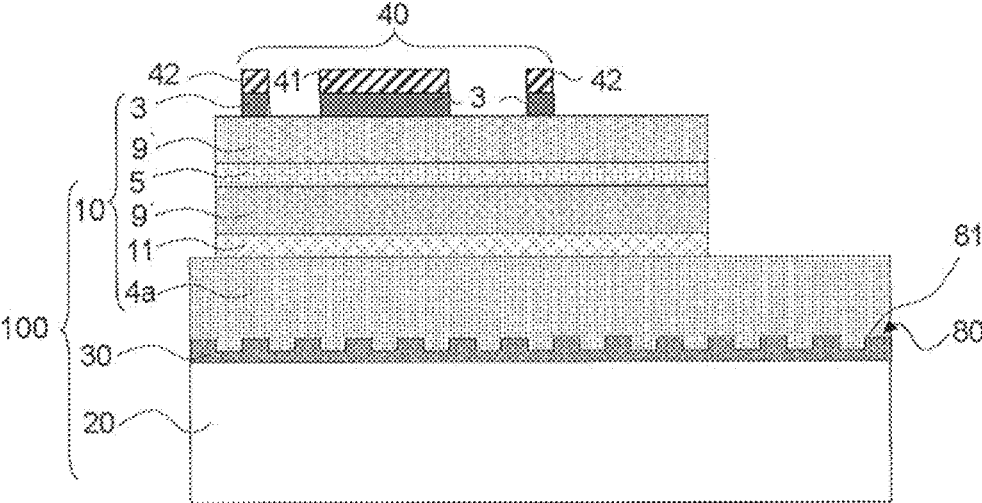
[FIG. 20]
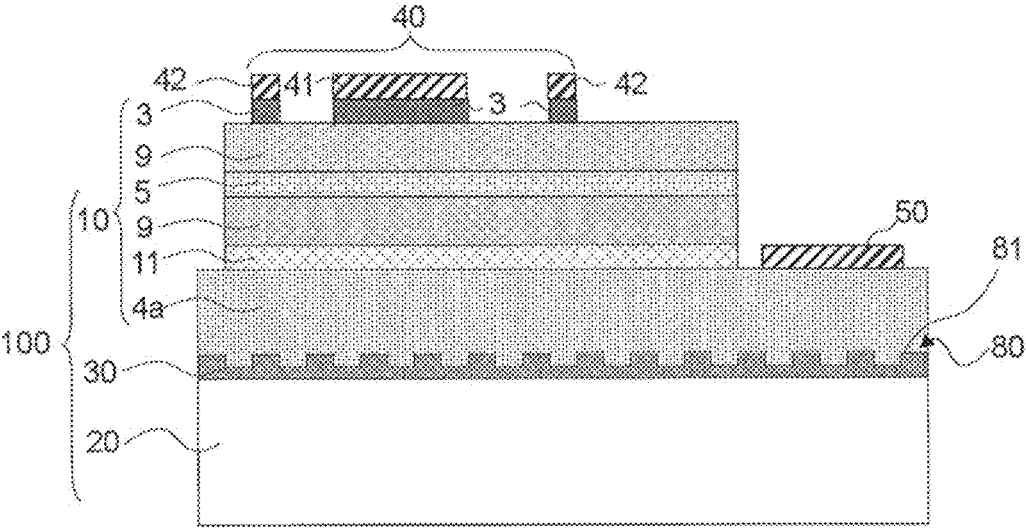

[FIG. 21]
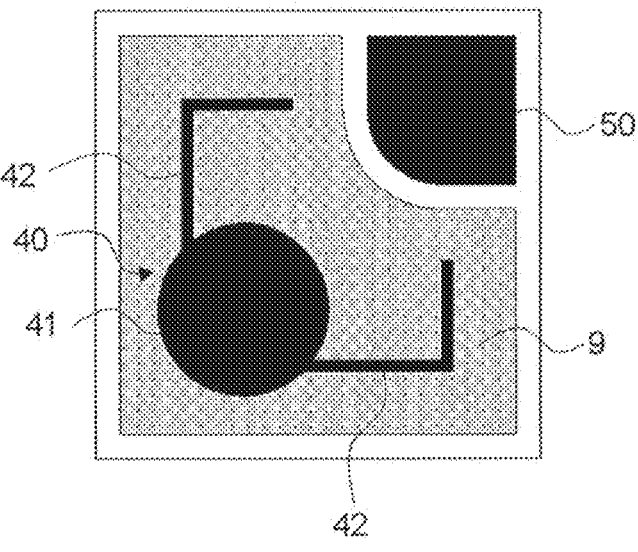
[FIG. 22]
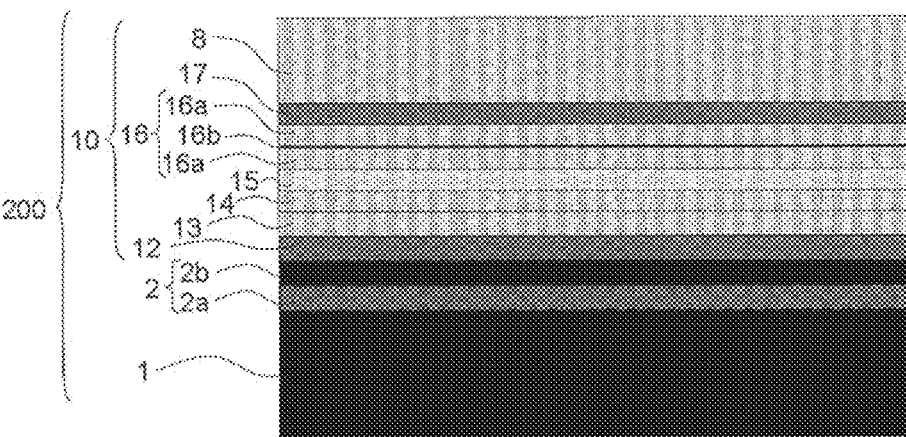
[FIG. 23]
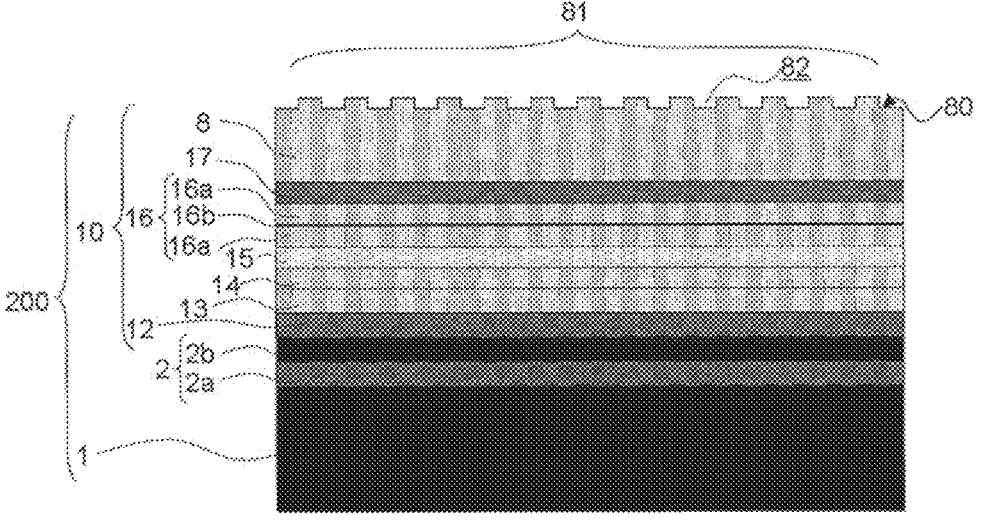

[FIG. 24]
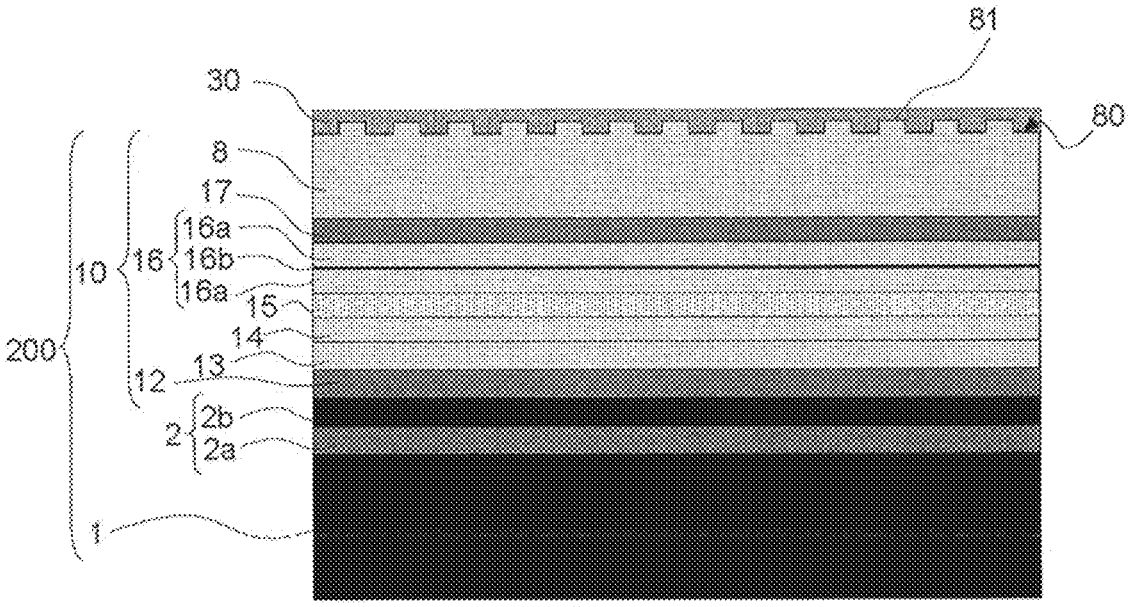
[FIG. 25]
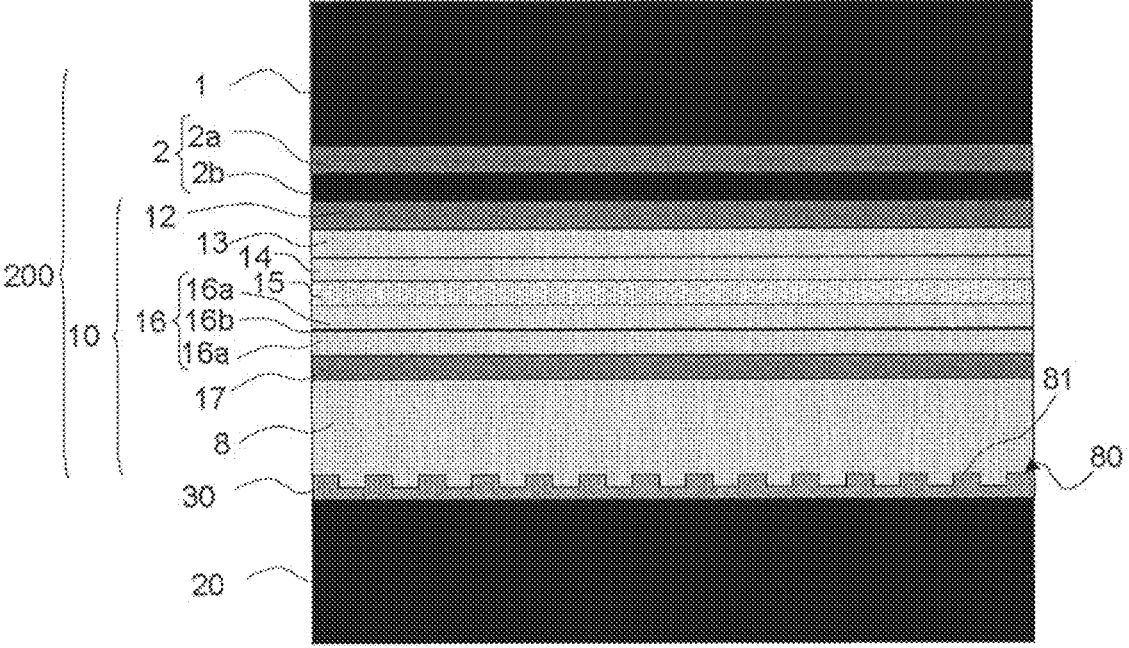

[FIG. 26]
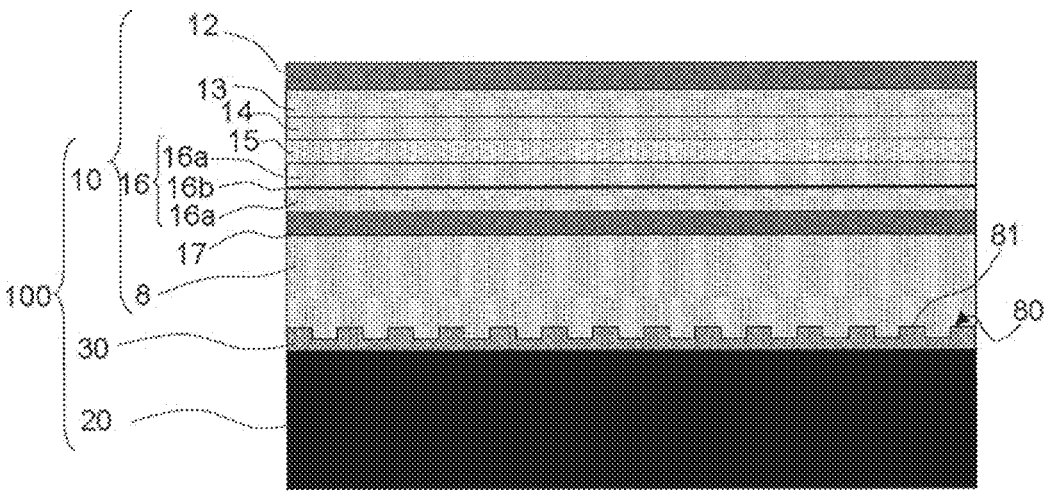
[FIG. 27]
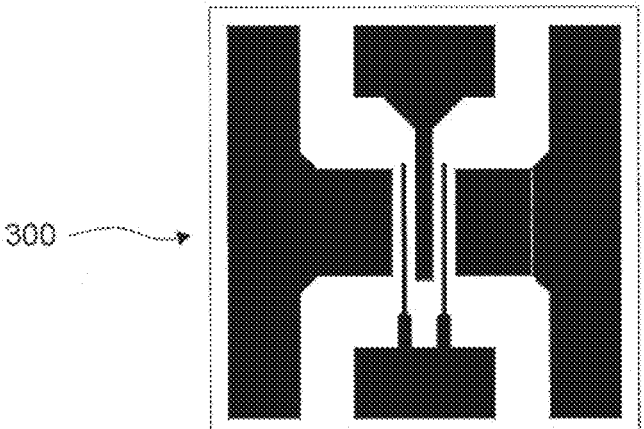
[FIG. 28]
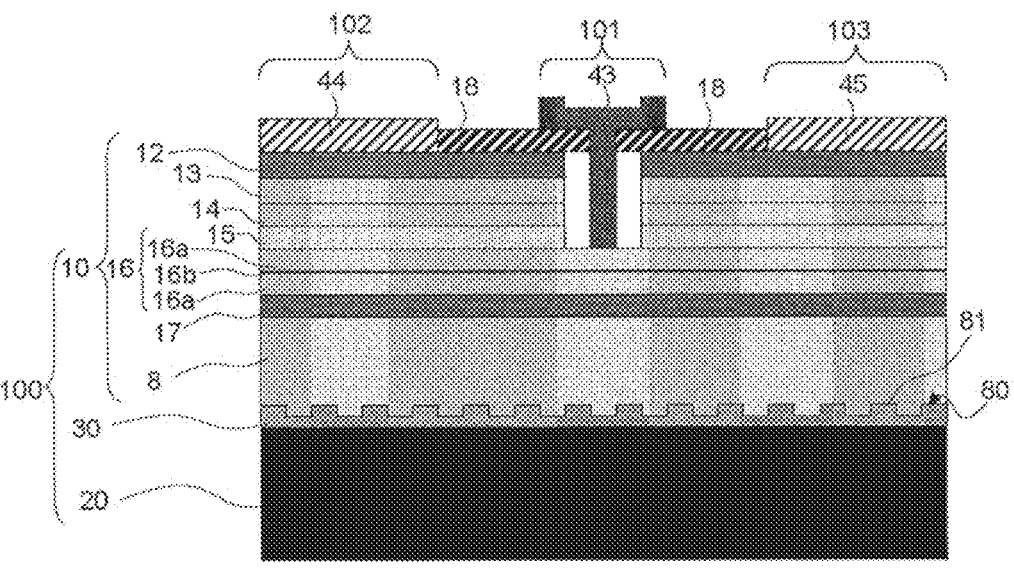

[FIG. 29]
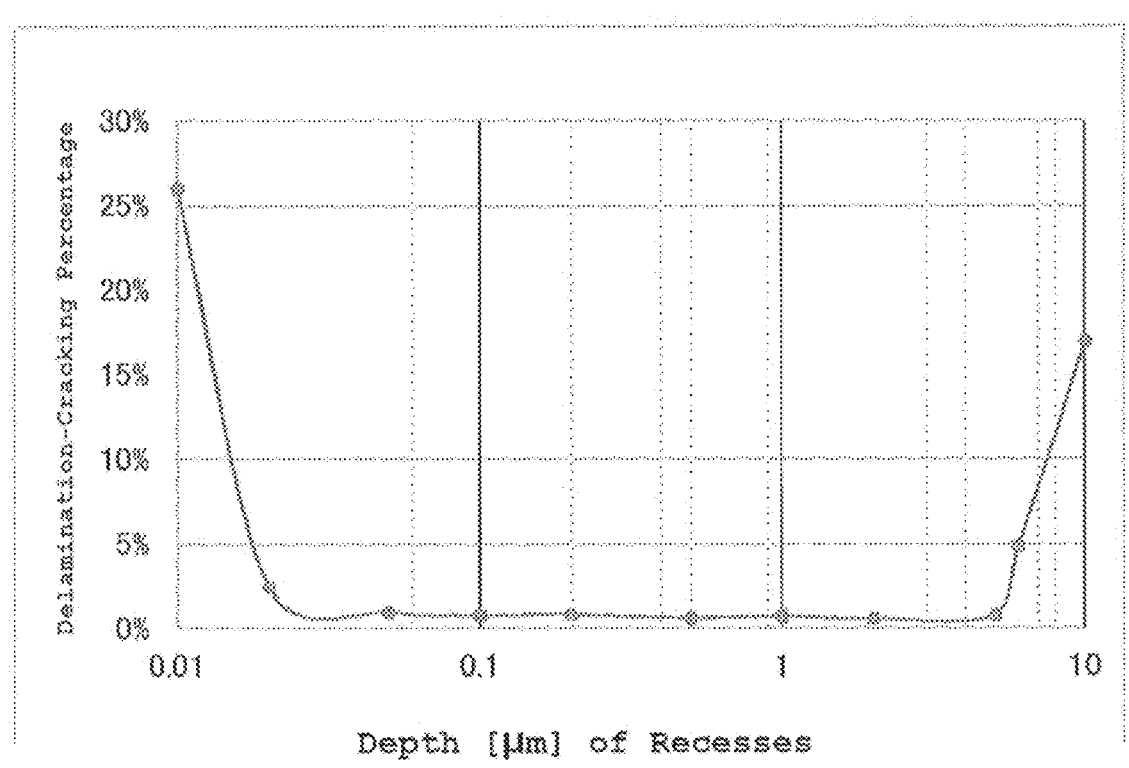

BONDED SEMICONDUCTOR DEVICE AND METHOD FOR MANUFACTURING BONDED SEMICONDUCTOR DEVICE

TECHNICAL FIELD

The present invention relates to a bonded semiconductor device and a method for manufacturing a bonded semiconductor device.

BACKGROUND ART

Various bonded semiconductor devices have been proposed as novel functional substrates obtained by combining properties of a compound semiconductor with another functional substrate.

In an IoT sensor, a functional chip can be manufactured on a silicon substrate having a drive substrate by mounting: a photovoltaic cell (PV) as a passive power source; a photodiode (PD) as a signal receiver; and a laser diode (LD) or a light-emitting diode (LED) as a signal transmitter.

As the light-emitting diode, there have been proposed: an LED in which a light-emitting layer is bonded to a silicon substrate by metal bonding; or an LED in which a light-emitting layer is bonded to a transparent sapphire substrate with a transparent adhesive.

Any of the structures are characterized by being manufactured by bonding materials which are different from each other in physical properties, such as linear expansion coefficient and refractive index.

In the technique of bonding different types of materials, attention has been focused on the bonding material itself. After the bonding, the device needs to be packaged. In the packaging process or during operation after the packaging, the difference types of materials undergo thermal hysteresis to some extent, so that the difference in physical properties sometimes causes failures.

The likely failures are delamination from the bonding surface and breakage that occur at the portion of a compound semiconductor functional layer (epitaxial layer), which is a thin portion.

Regarding a bonded semiconductor device having a structure in which an epitaxial layer including a device layer (functional layer) is bonded to a support substrate made of a material different from that of this epitaxial layer, since the temperature at the time of bonding differ from the operation temperature or room temperature, residual stress is present between the epitaxial layer and the support substrate. Such bonded semiconductor devices repeatedly expand and contract as the temperature changes by operation or the environment temperature changes. Hence, the epitaxial layer is likely to delaminate from the bonding interface. This results in problems of operation failure by the bonded semiconductor device, and low reliability. The specific example is illustrated below.

When an encapsulation material is injected to perform packaging, the injection is performed with heating to a temperature of the softening point or higher in order to soften the encapsulation material. After the injection, the temperature of the encapsulation material is lowered to no higher than the softening point (generally room temperature), and the packaging is performed.

In the process of encapsulation material injection, each of the epitaxial layer (compound semiconductor) portion as the functional portion, the bonding portion, and the support substrate portion as the supporting portion receives a similar temperature, and contracts according to its own physical properties when the temperature is lowered to room temperature. These portions have stresses due to the thermal contraction because the thermal expansion coefficients are not generally the same.

If the stress is excessively high, it can be detected as a failure immediately after the packaging. Meanwhile, in a case where no breakage occurs immediately after the packaging, the temperature inside the package increases and decreases by current flow and operation, so that delamination or breakage gradually proceeds. After a time elapses, delamination or breakage occurs, and the device fails to operate.

In cases of a single part, just one failure occurs. Meanwhile, if multiple functional sections are mounted on one chip, the entire chip is influenced, so that delamination or breakdown of one functional portion leads to breakdown of the entire system.

CITATION LIST

Patent Literature

Patent Document 1: JP 5008308 B

SUMMARY OF INVENTION

Technical Problem

To solve these problems, effective means is that the materials constituting a support substrate and an epitaxial layer are made to have substantially the same thermal expansion coefficients. However, it is impossible to select materials which have the same thermal expansion coefficient but have different values for other physical properties.

Hence, for a bonded semiconductor device having a structure in which a material having a function to operation as a device is selected and bonded to a substrate made of a different type of material for support and so forth, a configuration or structure is required so as to minimize the influence of expansion and contraction due to temperature change.

The present invention has been made in view of the above problems. An object of the present invention is to provide: a bonded semiconductor device capable of suppressing occurrence of delamination and breakage due to temperature increase and decrease; and a manufacturing method enabling manufacturing of a bonded semiconductor device capable of suppressing occurrence of delamination and breakage due to temperature increase and decrease.

Solution to Problem

To achieve the object, the present invention provides a bonded semiconductor device comprising:

an epitaxial layer; and a support substrate made of a material different from that of the epitaxial layer and bonded to the epitaxial layer, wherein any one of the epitaxial layer and the support substrate has a bonding surface comprising a radial pattern including recesses or protrusions radially spreading from a certain point on the bonding surface as a center.

As the radial pattern including recesses or protrusions is formed on the bonding surface as described above, this facilitates expansion in directions along the recesses or protrusions when heat is applied, or facilitates contraction in these directions when the temperature is lowered, and the expansion-contraction directions can be controlled. As a result, the inventive bonded semiconductor device is capable of suppressing occurrence of delamination and breakage due to temperature increase and decrease.

The recesses or the protrusions of the radial pattern preferably have a depth or height H of 0.02 μm or more and 5 μm or less.

The recesses or protrusions of the radial pattern with a depth or height H of 0.02 μm or more and 5 μm or less make it possible to further suppress occurrence of delamination and breakage due to temperature increase and decrease.

The recesses or the protrusions of the radial pattern can extend continuously or discretely in directions away from the center.

In this manner, the form of the recesses or protrusions is not particularly limited, and various aspects can be employed.

The radial pattern is preferably provided on the epitaxial layer side.

The bonded semiconductor device having the radial pattern formed on the epitaxial layer side can further suppress occurrence of delamination and breakage due to temperature increase and decrease.

Optionally, the support substrate may comprise any material selected from the group consisting of AlN, Al₂O₃, Cu, GaAs, GaN, GaP, InP, Si, SiC, and SiO₂, and the material of the support substrate may have a crystal structure or amorphous structure.

The present invention can be suitably adopted with such materials.

The inventive bonded semiconductor device may comprise a metal film or thermosetting resin interposed for bonding between the epitaxial layer and the support substrate.

As a bonding material of the bonding layer between the epitaxial layer and the support substrate, a metal film or thermosetting resin is usable, for example.

Moreover, the present invention provides a method for manufacturing a bonded semiconductor device including an epitaxial layer, and a support substrate made of a material different from that of the epitaxial layer and bonded to the epitaxial layer, the method comprising:

providing a radial pattern including recesses or protrusions radially spreading from a certain point, as a center, on any one of a bonding surface of the epitaxial layer and a bonding surface of the support substrate; and bonding the epitaxial layer to the support substrate such that the bonding surface of the epitaxial layer faces the bonding surface of the support substrate.

Forming a radial pattern including recesses or protrusions on a bonding surface and bonding such an epitaxial layer and a support substrate as described above facilitate expansion in directions along the recesses or protrusions when heat is applied, or contraction in these directions when the temperature is lowered, and make it possible to manufacture a bonded semiconductor device capable of controlling the expansion-contraction directions. As a result, a bonded semiconductor device manufactured according to the inventive method for manufacturing a bonded semiconductor device is capable of suppressing occurrence of delamination and breakage due to temperature increase and decrease.

The radial pattern is preferably provided such that the recesses or the protrusions have a depth or height H of 0.02 μm or more and 5 μm or less.

Forming the radial pattern having the recesses or protrusions with a depth or height H of 0.02 μm or more and 5 μm or less enables manufacturing of a bonded semiconductor device capable of further suppressing occurrence of delamination and breakage due to temperature increase and decrease.

The recesses or the protrusions can be provided to extend continuously or discretely in directions away from the center.

In this manner, the radial pattern including recesses or protrusions can be formed in various forms.

The radial pattern is preferably provided on the epitaxial layer side.

Forming the radial pattern on the epitaxial layer side enables manufacturing of a bonded semiconductor device that can further suppress occurrence of delamination and breakage due to temperature increase and decrease.

Optionally, a starting substrate of the epitaxial layer and the support substrate to be used each may comprise any material selected from the group consisting of AlN, Al₂O₃, Cu, GaAs, GaN, GaP, InP, Si, SiC, and SiO₂, the material of the starting substrate of the epitaxial layer to be used may have a crystal structure, and the material of the support substrate to be used may have a crystal structure or amorphous structure.

The present invention is suitably adoptable with such materials.

The epitaxial layer can be bonded to the support substrate with a metal film or thermosetting resin interposed therebetween.

For example, a metal film or a thermosetting resin is usable as a bonding material of the bonding layer between the epitaxial layer and the support substrate.

Advantageous Effects of Invention

As described above, the inventive bonded semiconductor device is capable of controlling the expansion-contraction directions, and thus suppressing occurrence of delamination and breakage due to temperature increase and decrease. Accordingly, the inventive bonded semiconductor device can exhibit excellent reliability.

Moreover, the inventive method for manufacturing a bonded semiconductor device makes it possible to manufacture a bonded semiconductor device capable of suppressing occurrence of delamination and breakage due to temperature increase and decrease by controlling the expansion-contraction directions. Accordingly, the inventive method for manufacturing a bonded semiconductor device enables manufacturing of bonded semiconductor devices excellent in reliability and applicable to usages in, for example, optical wireless power-receiving devices, photovoltaic cells, light-emitting devices, light-receiving devices, etc.

BRIEF DESCRIPTION OF DRAWINGS

FIG. 1 is a schematic sectional view showing an example of a bonded semiconductor device of the present invention.

FIG. 2 is a schematic drawing of a radial pattern which an example of the inventive bonded semiconductor device includes.

FIG. 3 illustrates schematic sectional drawings of recesses on a bonding surface according to some examples of the inventive bonded semiconductor device.

FIG. 4 illustrates schematic drawings of radial patterns which some examples of the inventive bonded semiconductor device include.

FIG. 5 is a schematic sectional view for illustrating one step of a method for manufacturing a bonded semiconductor device according to a first embodiment of the present invention.

FIG. 6 is a schematic sectional view for illustrating one step of the method for manufacturing a bonded semiconductor device according to the first embodiment of the present invention.

FIG. 7 is a schematic sectional view for illustrating one step of the method for manufacturing a bonded semiconductor device according to the first embodiment of the present invention.

FIG. 8 is a schematic sectional view for illustrating one step of the method for manufacturing a bonded semiconductor device according to the first embodiment of the present invention.

FIG. 9 is a schematic sectional view for illustrating one step of the method for manufacturing a bonded semiconductor device according to the first embodiment of the present invention.

FIG. 10 is a schematic sectional view for illustrating one step of the method for manufacturing a bonded semiconductor device according to the first embodiment of the present invention.

FIG. 11 is a schematic sectional view showing a bonded semiconductor device according to the first embodiment of the present invention.

FIG. 12 is a schematic plan view of an upper electrode shown in FIG. 11.

FIG. 13 is a schematic sectional view for illustrating one step of a method for manufacturing a bonded semiconductor device according to a second embodiment of the present invention.

FIG. 14 is a schematic sectional view for illustrating one step of the method for manufacturing a bonded semiconductor device according to the second embodiment of the present invention.

FIG. 15 is a schematic sectional view for illustrating one step of the method for manufacturing a bonded semiconductor device according to the second embodiment of the present invention.

FIG. 16 is a schematic sectional view for illustrating one step of the method for manufacturing a bonded semiconductor device according to the second embodiment of the present invention.

FIG. 17 is a schematic sectional view for illustrating one step of the method for manufacturing a bonded semiconductor device according to the second embodiment of the present invention.

FIG. 18 is a schematic sectional view for illustrating one step of the method for manufacturing a bonded semiconductor device according to the second embodiment of the present invention.

FIG. 19 is a schematic sectional view for illustrating one step of the method for manufacturing a bonded semiconductor device according to the second embodiment of the present invention.

FIG. 20 is a schematic sectional view showing a bonded semiconductor device according to the second embodiment of the present invention.

FIG. 21 is a schematic plan view showing a portion of the bonded semiconductor device according to the second embodiment of the present invention.

FIG. 22 is a schematic sectional view for illustrating one step of a method for manufacturing a bonded semiconductor device according to a third embodiment of the present invention.

FIG. 23 is a schematic sectional view for illustrating one step of the method for manufacturing a bonded semiconductor device according to the third embodiment of the present invention.

FIG. 24 is a schematic sectional view for illustrating one step of the method for manufacturing a bonded semiconductor device according to the third embodiment of the present invention.

FIG. 25 is a schematic sectional view for illustrating one step of the method for manufacturing a bonded semiconductor device according to the third embodiment of the present invention.

FIG. 26 is a schematic sectional view for illustrating one step of the method for manufacturing a bonded semiconductor device according to the third embodiment of the present invention.

FIG. 27 is a schematic plan view showing an electrode pattern formed by the method for manufacturing a bonded semiconductor device according to the third embodiment of the present invention.

FIG. 28 is a schematic sectional view showing a bonded semiconductor device according to the third embodiment of the present invention.

FIG. 29 is a graph showing a relation between the depth of recesses and the delamination-cracking percentage in Examples.

DESCRIPTION OF EMBODIMENTS

As noted above, there have been demands for the development of a bonded semiconductor device that can suppress occurrence of delamination and breakage due to temperature increase and decrease; and a manufacturing method capable of manufacturing such a bonded semiconductor device.

The present inventor and colleagues have earnestly studied the above problems and consequently found that when an epitaxial layer is bonded to a support substrate made of a material different from that of this epitaxial layer to manufacture a bonded semiconductor device, bonding the epitaxial layer and the support substrate with a radial pattern including recesses or protrusions provided on a bonding surface facilitates expansion in directions along the recesses or protrusions when heat is applied, or facilitates contraction in the directions when the temperature is lowered, making it possible to control the expansion-contraction directions. This finding has led to the completion of the present invention.

Specifically, the present invention relates to a bonded semiconductor device comprising:

an epitaxial layer; and a support substrate made of a material different from that of the epitaxial layer and bonded to the epitaxial layer, wherein any one of the epitaxial layer and the support substrate has a bonding surface comprising a radial pattern including recesses or protrusions radially spreading from a certain point on the bonding surface as a center.

Moreover, the present invention relates to a method for manufacturing a bonded semiconductor device including an epitaxial layer, and a support substrate made of a material different from that of the epitaxial layer and bonded to the epitaxial layer, the method comprising:

providing a radial pattern including recesses or protrusions radially spreading from a certain point, as a center, on any one of a bonding surface of the epitaxial layer and a bonding surface of the support substrate; and bonding the epitaxial layer to the support substrate such that the bonding surface of the epitaxial layer faces the bonding surface of the support substrate.

Incidentally, Patent Document 1 discloses a light-emitting device including a transparent substrate and a light emitting stack which are bonded with a transparent adhesive layer, for example, benzocyclobutene (BCB) or the like, interposed therebetween. The bonding portion has, for example, a rough surface with convex-concave or micro protrusions, such as pyramid shape. However, the convex-concave portions or the like disclosed in Patent Document 1 are arranged randomly, and the expansion-contraction directions cannot be controlled. Patent Document 1 does not describe or suggest any radial pattern including recesses or protrusions that radially spread.

Hereinafter, the present invention will be described in detail with reference to the drawings, but the present invention is not limited thereto.

[Bonded Semiconductor Device]

The inventive bonded semiconductor device is characterized as follows. The bonded semiconductor device includes: an epitaxial layer; and a support substrate made of a material different from that of the epitaxial layer and bonded to the epitaxial layer. Any one of the epitaxial layer and the support substrate has a bonding surface with a radial pattern including recesses or protrusions that radially spread from a certain point on the bonding surface as the center.

The radial pattern including recesses or protrusions formed on a bonding surface facilitates radial expansion in directions along the recesses or protrusions when heat is applied, or facilitates radial contraction in the directions when the temperature is lowered. This makes it possible to control the expansion-contraction directions. Consequently, the inventive bonded semiconductor device is capable of suppressing occurrence of delamination and breakage due to temperature increase and decrease.

Particularly, the epitaxial layer as a functional layer portion can be a thin film and tends to be ductile. However, the ductility direction does not always coincide with that of the support substrate. Particularly, when the epitaxial layer has the crystal axis tilted, the ductility direction is considerably different from that of the support substrate in many cases.

In such cases, the thermal expansion directions do not coincide, so that breakage or delamination is likely to occur. Nevertheless, providing a radial pattern including recesses or protrusions on a bonding surface makes it possible to suppress delamination and breakage, or to increase the critical temperature in the processing during which delamination or breakage otherwise occurs.

The recesses or protrusions of the radial pattern preferably have a depth or height H of 0.02 μm or more and 5 μm or less.

With the depth or height H of the recesses or protrusions being 0.02 μm or more and 5 μm or less in the radial pattern, it is possible to surely suppress occurrence of delamination and breakage due to temperature increase and decrease.

The radial pattern may be composed of either protrusions or recesses, but it is necessary to set the sizes and aspect ratio of the width and depth (step) of the pattern so as to allow a bonding material to enter. Preferably, H/L is 1 or more and 50 or less, where H represents the depth or height of the recesses or protrusions, and L represents the breadth.

The recesses or protrusions of the radial pattern may extend continuously or discretely in directions away from the center.

In this manner, the form of the recesses or protrusions is not particularly limited, and various aspects are possible.

The radial pattern is preferably provided on the epitaxial layer side.

The bonded semiconductor device with the radial pattern provided on the epitaxial layer side can further control the expansion and contraction directions of the epitaxial layer, and can further suppress occurrence of delamination and breakage due to temperature increase and decrease.

The support substrate can contain any material selected from the group consisting of AlN, $Al_2O_3$, Cu, GaAs, GaN, GaP, InP, Si, SiC, and $SiO_2$, and the material of the support substrate can have a crystal structure or amorphous structure.

To such materials, the present invention is suitably adoptable.

The epitaxial layer can be bonded to the support substrate with a metal film or thermosetting resin interposed therebetween.

For example, a metal film or thermosetting resin can be used as the bonding material between the epitaxial layer and the support substrate. It is a matter of course that bonding materials other than these may be used.

The metal film as the bonding material can contain, for example, at least one soft metal selected from the group consisting of Au, Ag, Al, Cu, Ga, and In. The metal film may further include a metal layer, such as a Ti layer.

Alternatively, the metal film may include a structure having two or more metal layers containing Ge, Si, etc., which can readily achieve ohmic contact. Equivalent effect can also be obtained from a Ni-containing layer incorporated at a side adjacent to the epitaxial layer or support substrate in order to readily achieve electrical contact.

Examples of the thermosetting resin can include benzocyclobutene and polyimide.

The inventive bonded semiconductor device is applicable to various usages. For example, the inventive bonded semiconductor device is useful as a bonded semiconductor in, for example, optical wireless power-receiving devices, photovoltaic cells, light-emitting devices, light-receiving devices, etc.

Next, some examples of the inventive bonded semiconductor device will be specifically described with reference to FIGS. 1 to 4.

A bonded semiconductor device 100 shown in FIG. 1 includes an epitaxial layer 10 and a support substrate 20. The epitaxial layer 10 is bonded to the support substrate 20 with a bonding layer 30 interposed therebetween.

The epitaxial layer 10 has a radial pattern 81 shown in FIG. 2 on a bonding surface 80 that is bonded to the support substrate 20. The radial pattern 81 is composed of multiple recesses 82 shown in FIG. 1 and FIG. 2.

The multiple recesses 82 each have a rectangular cross section as shown in FIG. 1. Moreover, as shown in FIG. 2, the multiple recesses 82 radially spread from a certain point 83 on the bonding surface 80 as the center, so that the radial pattern 81 is formed.

In the example shown in FIG. 2, the multiple recesses 82 discretely extend in directions away from the center 83.

FIG. 1 illustrates a case where the recesses 82 have rectangular sectional shapes. Nevertheless, as illustrated in FIG. 3 (A) to (C), the recesses 82 may have triangular or trapezoidal sectional shapes. In addition, the radial pattern 81 may be composed of protrusions instead of recesses.

Meanwhile, in a case where a device-planned area has a square pattern, an electrode is generally disposed at a central portion of the device-planned area. Hence, the central portion of the device-planned area is suitably disposed at a position corresponding to the center 83 of the radial pattern 81. It should be noted that in the case where the center 83 of the radial pattern 81 is suitably located at the central portion of the device-planned area, this means that one electrode is provided, and shall not apply to a case where multiple electrodes are provided. The material-stretching direction due to thermal expansion and the central point vary depending on the electrode arrangement or design. Nevertheless, the effects of the present invention are obtained by forming the radial pattern 81 such that a certain point on the bonding surface serves as the center 83. Accordingly, the center 83 of the radial pattern 81 does not always have to be set at the center or the center of gravity of the bonding surface, and the setting is not limited to the center or the center of gravity of the bonding surface.

Thus, the center 83 of the radial pattern 81 is not particularly limited, but should be at a certain point on the bonding surface 81.

Alternatively, the multiple recesses 82 may continuously extend in directions away from the center 83 as shown in FIG. 4 (A), for example.

To put it differently, the radial pattern 81 can take various forms in relation to the shape of the recesses 82 or protrusions and the position of the center 83, as shown in, for example, FIG. 2 and FIG. 4 (A) to (E).

[Method for Manufacturing Bonded Semiconductor Device]

The inventive method for manufacturing a bonded semiconductor device is a method for manufacturing a bonded semiconductor device including an epitaxial layer, and a support substrate made of a material different from that of the epitaxial layer and bonded to the epitaxial layer, the method being characterized by including:

providing a radial pattern including recesses or protrusions radially spreading from a certain point, as a center, on any one of a bonding surface of the epitaxial layer and a bonding surface of the support substrate; and bonding the epitaxial layer to the support substrate such that the bonding surface of the epitaxial layer faces the bonding surface of the support substrate.

Forming a radial pattern including recesses or protrusions on a bonding surface and bonding such an epitaxial layer and a support substrate as described above facilitates expansion in directions along the recesses or protrusions when heat is applied, or facilitates contraction in the directions when the temperature is lowered. This enables manufacturing of a bonded semiconductor device capable of controlling the expansion-contraction directions. As a result, a bonded semiconductor device manufactured by the inventive method for manufacturing a bonded semiconductor device successfully has less delamination and breakage due to temperature increase and decrease.

According to the inventive method for manufacturing a bonded semiconductor device, the inventive bonded semiconductor device described above can be manufactured.

The radial pattern is preferably provided such that the recesses or protrusions have a depth or height H of 0.02 μm or more and 5 μm or less.

Forming the recesses or protrusions with a depth or height H of 0.02 μm or more and 5 μm or less in the radial pattern enables manufacturing of a bonded semiconductor device capable of further suppressing occurrence of delamination and breakage due to temperature increase and decrease.

The radial pattern composed of protrusions may be formed, or the radial pattern composed of recesses may be formed. As already described, H/L is preferably 1 or more and 50 or less, where H represents the depth or height of the recesses or protrusions, and L represents the breadth.

It is possible to provide the recesses or protrusions extending continuously or discretely in directions away from the center.

In this manner, the radial pattern including recesses or protrusions can be formed in various forms.

In this case, the radial pattern is preferably provided on the epitaxial layer side.

Forming the radial pattern on the epitaxial layer side enables further control of the expansion and contraction directions of the epitaxial layer, and can manufacture a bonded semiconductor device capable of further suppressing occurrence of delamination and breakage due to temperature increase and decrease.

The radial pattern can be formed, for example, by: forming a radial pattern on the bonding surface of the epitaxial layer by a photolithography method; and performing etching of wet etching or dry etching based on the formed pattern to form a pattern with recesses or protrusions.

In wet etching, the radial pattern can be formed, for example, by: forming a resist pattern on the bonding surface by a photolithography method; and performing etching with a sulfuric acid-hydrogen peroxide or organic acid-hydrogen peroxide mixture solution, or a nitric acid-hydrochloric acid mixture solution, while the resist pattern is being used as a mask material.

In dry etching, the radial pattern can be formed, for example, by treatment with chlorine-based plasma, while the resist pattern is being used as a mask material.

In a specific example illustrated below, recesses are formed to a depth of about 1.0 μm in the radial pattern. Nevertheless, equivalent effect can also be obtained by forming deeper steps. However, since an acidic etchant mixed with hydrogen peroxide damages a resist, the radial pattern can be formed by using another mask material, for example, $SiO_2$ or the like when steps of 1.0 μm or deeper are to be provided.

It is possible to use a starting substrate of the epitaxial layer and the support substrate each of which contains any material selected from the group consisting of AlN, $Al_2O_3$, Cu, GaAs, GaN, GaP, InP, Si, SiC, and $SiO_2$, where the material of the starting substrate of the epitaxial layer has a crystal structure, and the material of the support substrate has a crystal structure or amorphous structure.

To such materials, the present invention is suitably adoptable.

The epitaxial layer can be bonded to the support substrate with a metal film or thermosetting resin interposed therebetween.

For example, a metal film or thermosetting resin is usable as a bonding material of the bonding layer between the epitaxial layer and the support substrate. As examples of the metal film and the thermosetting resin, for example, those described above can be used.

Next, some embodiments of the inventive bonded semiconductor device and method for manufacturing a bonded semiconductor device will be described in detail with reference to the drawings.

First Embodiment

As a first embodiment, an example of a bonded semiconductor device whose epitaxial layer has a PV (Photovoltaic) structure, and an example of a manufacturing method therefor will be described with reference to FIGS. 5 to 12.

First, an epitaxial wafer (PV epitaxial wafer) 200 is provided as shown in FIG. 5, in which an etch stop layer 2 is disposed between a starting substrate 1 and an epitaxial layer 10, and the epitaxial layer 10 has a PV (Photovoltaic) structure.

The PV epitaxial wafer 200 is provided by sequentially forming, on the p-type GaAs starting substrate 1: the p-In- $_x$Ga$_{1-x}$P (0.4≤x≤0.6) etch stop layer 2 having a film thickness of 0.2 μm; a p-GaAs contact layer 3 having a film thickness of 0.1 μm; a p-In$_x$Ga$_{1-x}$P (0.4≤x≤0.6) window layer 4 having a film thickness of 0.1 μm; a p-GaAs emitter layer 5 having a film thickness of 0.5 μm; an n-GaAs base layer 6 having a film thickness of 3.5 μm; a p-In$_x$Ga$_{1-x}$P (0.4≤x≤0.6) BSF layer 7 having a film thickness of 0.1 μm; and a GaAs unevenness-forming layer 8.

Next, along a device-planned area and size, a radial pattern is formed by a photolithography method on the GaAs unevenness-forming layer 8, which is located at the top surface of the epitaxial wafer 200. Based on the formed pattern, etching is performed by wet or dry etching to form a radial pattern including recesses or protrusions. FIG. 6 shows an example in which a radial pattern 81 composed of multiple recesses 82 having rectangular sectional shapes is formed on a bonding surface 80, which is a top surface of the unevenness-forming layer 8.

Suitably, the radial pattern 81 is provided such that the recesses 82 have a depth within a range of 0.02 to 5.0 μm. Such a radial pattern 81 can be formed, for example, by etching with a sulfuric acid-hydrogen peroxide or organic acid-hydrogen peroxide mixture solution, while a resist pattern is being used as a mask material.

In this illustrated example, the radial pattern 81 is formed to have steps of around 1.0 μm. Nevertheless, equivalent effect can also be obtained by forming deeper steps. However, since an acidic etchant mixed with hydrogen peroxide damages a resist, the radial pattern 81 can be formed by using another mask material, for example, SiO$_2$ or the like when steps of 1.0 μm or deeper are to be provided.

In this embodiment, the radial pattern 81 composed of the multiple recesses 82 is illustrated. Nevertheless, the radial pattern 81 may be composed of any of protrusions and recesses. However, it is necessary to set the sizes and aspect ratio of the width and depth (step) of the pattern so as to allow a bonding material to enter. H/L is preferably 1 or more and 50 or less, where H represents the depth or height of the recesses or protrusions, and L represents the breadth.

In this embodiment, the radial pattern 81 shown in FIG. 4 (A) is formed. More specifically, the radial pattern 81 thus formed is a pattern in which a center 83 of the radial pattern 81 is located at a position offset from the device-planned area.

Next, as shown in FIG. 7, a bonding-metal film 31 is formed on the bonding surface 80, which is the surface of the unevenness-forming layer 8 where the radial pattern 81 is formed. As the bonding-metal film 31, for example, a metal layer made of Ti/Au can be formed. The Ti layer can be for example 0.1 μm thick, and the Au layer can be for example 1.0 μm.

Note that the bonding-metal film 31 to be employed can contain a soft metal including at least one or more of Au and Ag, Al, Cu, Ga, In, etc., for example. As the soft metal, any material can be selected.

Meanwhile, other than the bonding with the bonding-metal film, a thermosetting resin, such as benzocyclobutene (BCB) or polyimide (PI), may be used for the bonding.

Next, a silicon wafer is provided as a support substrate (substrate to be bonded) 20. As shown in FIG. 8, a bonding-metal film 32 made of Ti/Au is formed on a top surface of the support substrate 20. The Ti layer can be for example 0.1 μm thick, and the Au layer can be for example 1.0 μm.

Note that, like the bonding-metal film 31, the bonding-metal film 32 to be employed can contain a soft metal including at least one or more of Au and Ag, Al, Cu, Ga, In, etc., for example. As the soft metal, any material can be selected.

In addition, the bonding-metal film 31 or 32 may include a structure having two or more metal layers containing Ge, Si, etc., which can readily achieve ohmic contact. Equivalent effect can also be obtained from a structure provided with a Ni-containing layer between the semiconductor and the Ti layer in order to readily achieve electrical contact.

Next, as shown in FIG. 9, the epitaxial wafer 200 having the bonding-metal film 31 and the support substrate 20 having the bonding-metal film 32 are subjected to thermo-compression bonding with the bonding-metal films 31 and 32 facing and being superposed on each other. In a case where a metal layer mainly containing Au is used as the bonding metal, this bonding is suitably performed at a bonding temperature within a range of around 300 to 450° C. Moreover, the bonding is suitably performed with 50 to 500 N/cm$^2$ or more at the compression bonding portion.

These conditions are suitable conditions for obtaining sufficient bonding strength. The temperature may be lower or higher than this range. The bonding pressure may be lower or higher than this range.

After the bonding, the starting substrate 1 (GaAs) is removed with ammonia hydrogen peroxide-based etchant. After the starting substrate 1 is removed, the p-InGaP etching stop layer 2 is removed with hydrochloric acid-based etchant to expose the p-GaAs contact layer 3 as shown in FIG. 10. Thereby, a bonded semiconductor device 100 according to the first embodiment of the present invention shown in FIG. 10 is obtained, in which the epitaxial layer 10 is bonded to the support substrate 20 with a bonding layer 30 interposed therebetween, the bonding layer 30 constituted of the metal bonding layers 31 and 32.

Next, as shown in FIG. 11, an electrode 40 for current conduction is formed on the p-GaAs contact layer 3.

As shown in FIG. 12, the electrode 40 is configured to have: a semi-circular electrode 41 disposed for bonding pad; and branched electrodes 42 for current extraction extending from the electrode 41 for bonding pad.

In the electrode 40, a Zn-doped Au layer, a Ti layer, and a Au layer can be sequentially arranged in this order starting from the layer adjacent to the p-GaAs contact layer 3. The Zn-doped Au layer can be for example 0.1 μm thick, the Ti layer can be for example 0.1 μm, and the Au layer can be for example 2.0 μm.

Second Embodiment

As a second embodiment, an example of a bonded semi-conductor device whose epitaxial layer has an LED structure, and an example of a manufacturing method therefor will be described with reference to FIGS. 13 to 21.

First, an epitaxial wafer (LED epitaxial wafer) 200 is provided as shown in FIG. 13, in which an etch stop layer 2 is disposed between a starting substrate 1 and an epitaxial layer 10, and the epitaxial layer 10 has an LED structure.

As shown in FIG. 13, the LED epitaxial wafer 200 is provided by sequentially forming, on the p-type GaAs starting substrate 1: the p-In$_x$Ga$_{1-x}$P (0.4≤x≤0.6) etch stop layer 2; a p-GaAs contact layer 3; a p-(Al$_y$Ga$_{1-y}$)$_z$In$_{1-z}$P (0<y≤1, 0.4≤z≤0.6) cladding layer 9; an i-(Al$_y$Ga$_{1-y}$)$_z$In$_{1-z}$P (0≤y≤0.4, 0.4≤z≤0.6) active layer (emitter layer) 5; an n-(Al$_y$Ga$_{1-y}$)$_z$In$_{1-z}$P (0<y≤1, 0.4≤z≤0.6) cladding layer 9; an n-In$_x$Ga$_{1-x}$P (0.5<x<1.0) middle layer 11; and an n-GaP window layer-cum-unevenness-forming layer 4a.

Next, along a device-planned area and size, a radial pattern is formed by a photolithography method on the n-GaP window layer-cum-unevenness-forming layer 4a, which is located at the top surface of the epitaxial wafer 200. Based on the formed radial pattern, etching is performed by wet or dry etching to form a radial pattern including recesses or protrusions. FIG. 14 shows an example in which a radial pattern 81 composed of multiple recesses 82 having rectangular sectional shapes is formed on a bonding surface 80, which is a top surface of the window layer-cum-unevenness-forming layer 4a.

Suitably, the radial pattern 81 is provided such that the recesses 82 have a depth within a range of 0.02 to 5.0 μm. Such a radial pattern 81 can be formed by treatment, for example, wet etching with a nitric acid-hydrochloric acid mixture solution, or dry etching with a chlorine-based plasma, while a resist pattern is being used as a mask material.

In this illustrated example, the radial pattern 81 is formed to have steps of around 1.0 μm. Nevertheless, equivalent effect can also be obtained by forming deeper steps.

In this embodiment, the radial pattern 81 composed of the multiple recesses 82 is illustrated. Nevertheless, the radial pattern 81 may be composed of any of protrusions and recesses. However, it is necessary to set the sizes and aspect ratio of the width and depth (step) of the pattern so as to allow a bonding material to enter. H/L is preferably 1 or more and 50 or less, where H represents the depth or height of the recesses or protrusions, and L represents the breadth.

In this embodiment, the radial pattern 81 shown in FIG. 4 (E) is formed. The radial pattern 81 thus formed is a pattern in which a central portion 83 of the radial pattern 81 is located at a position somewhat offset from the device-planned area.

Next, as shown in FIG. 15, a bonding layer 30 made of BCB is formed by spin coating on the bonding surface 80, which is the surface of the window layer-cum-unevenness-forming layer 4a where the radial pattern 81 is formed.

The thickness of the bonding layer 30 made of BCB can be for example 2.0 μm. This thickness is just an example, and any layer thickness can be selected, as long as it is not thinner than the steps in the radial pattern 81. Moreover, in this embodiment, BCB is exemplified as the bonding material of the bonding layer 30, but equivalent effect can also be obtained by using other thermosetting materials transparent to light, such as PI, sol-gel solutions, and low-dielectric glasses.

Meanwhile, besides the use of BCB as the bonding material, a metal bonding layer may be used as the bonding material.

Next, a sapphire substrate is provided as a support substrate (substrate to be bonded) 20.

Next, as shown in FIG. 16, the epitaxial wafer 200 having the BCB bonding layer 30 and the support substrate 20 are made to face with and be superposed on each other with the BCB bonding layer 30 sandwiched therebetween, and are subjected to thermocompression bonding.

Note that the BCB bonding material does not always have to be applied on the support substrate 20. Alternatively, the BCB bonding material may by applied only on the support substrate 20 without the application to the epitaxial wafer 200 side.

When BCB is employed as the bonding material, the thermocompression bonding is suitably performed within a range of 150 to 400° C. Moreover, the bonding is suitably performed with 50 to 500 N/cm² or more at the compression bonding portion.

These conditions are suitable conditions for obtaining sufficient bonding strength. The temperature may be lower or higher than this range. The bonding pressure may be lower or higher than this range.

After the bonding, the starting substrate (GaAs) 1 is removed with ammonia hydrogen peroxide-based etchant. After the starting substrate 1 is removed, the p-InGaP etching stop layer 2 is removed with hydrochloric acid-based etchant to expose the p-GaAs contact layer 3. Thereby, a bonded semiconductor device 100 according to the second embodiment of the present invention shown in FIG. 17 is obtained, in which the epitaxial layer 10 is bonded to the support substrate 20 with the bonding layer 30 interposed therebetween.

Next, as shown in FIG. 18, an upper electrode 40 for current conduction is formed on the p-GaAs contact layer 3 and the region of the p-GaAs contact layer 3 except for a region covered with the electrode 40 is removed with a sulfuric acid-hydrogen peroxide mixture or the like.

As shown in FIG. 21, the upper electrode 40 is configured to have: a circular electrode 41 disposed for bonding pad; and branched electrodes 42 for current extraction extending from the electrode 41 for bonding pad.

Next, a part of the epitaxial layer 10 outside the region where the electrode 40 is formed is partially cut away, and a portion of the n-GaP window layer-cum-unevenness-forming layer 4a is exposed as shown in FIG. 19.

Next, as shown in FIG. 20, a lower electrode 50 is formed on a section of the exposed n-GaP window layer-cum-unevenness-forming layer 4a. FIG. 21 is a schematic plan view of the bonded semiconductor device according to the second embodiment after the lower electrode 50 is formed.

In the upper electrode 40, a Zn-doped Au layer, a Ti layer, and a Au layer can be sequentially arranged in this order starting from the layer adjacent to the p-GaAs contact layer 3. The Zn-doped Au layer can be for example 0.1 μm thick, the Ti layer can be for example 0.1 μm, and the Au layer can be for example 2.0 μm.

Moreover, in the lower electrode 50, a Ge-doped Au layer, a Ni layer, a Ti layer, and a Au layer can be sequentially arranged in this order starting from the layer adjacent to the n-GaP window layer-cum-unevenness-forming layer 4a. The Ge-doped Au layer can be for example 0.1 μm thick, the Ni layer can be for example 0.1 μm, the Ti layer can be for example 0.1 μm, and the Au layer can be for example 2.0 μm.

Third Embodiment

As a third embodiment, an example of a bonded semiconductor device whose epitaxial layer has a HEMT structure, and an example of a manufacturing method therefor will be described with reference to FIGS. 22 to 28.

First, an epitaxial wafer (HEMT epitaxial wafer) 200 is provided as shown in FIG. 22, in which an etch stop layer 2 is disposed between a starting substrate 1 and an epitaxial layer 10, and the epitaxial layer 10 has a HEMT structure.

As shown in FIG. 22, the HEMT epitaxial wafer 200 can be provided by sequentially forming, on the n-type InP starting substrate 1: an etch stop layer 2 including an $n^+$-$In_xGa_{1-x}As$ ($0.4 \leq x \leq 0.6$) etch stop layer 2a and an $n^+$-InP etch stop layer 2b; an $n^+$-InGaAs contact layer 12; an $n^+$-InAlAs layer 13; an i-InAlAs layer 14; an i-InP etch stop layer 15; an i-InAlAs-containing layer 16 including a Si delta-doped (δ-doped) layer 16b and two i-InAlAs layers 16a sandwiching the layer 16b therebetween; an i-InGaAs layer 17; and an i-InAlAs unevenness-forming layer 8.

Next, along a device-planned area and size, a radial pattern is formed by a photolithography method on the i-InAlAs unevenness-forming layer 8, which is located at the top surface of the epitaxial wafer 200. Based on the formed pattern, etching is performed by wet or dry etching to form a radial pattern including recesses or protrusions. FIG. 23 shows an example in which a radial pattern 81 composed of multiple recesses 82 having rectangular sectional shapes is formed on a bonding surface 80, which is a top surface of the unevenness-forming layer 8.

In this embodiment, the radial pattern 81 shown in FIG. 2 is formed. The radial pattern 81 thus formed is a pattern in which a central portion 83 of the radial pattern 81 is located at a central portion of the device-planned area.

Suitably, the radial pattern 81 is provided such that the recesses 82 have a depth within a range of 0.02 to 5.0 μm. Such a radial pattern 81 can be formed by treatment, for example, wet etching with a nitric acid-hydrochloric acid mixture solution, or dry etching with a chlorine-based plasma, while a resist pattern is being used as a mask material.

In this illustrated example, the radial pattern 81 is formed to have steps of around 1.0 μm. Nevertheless, equivalent effect can also be obtained by forming deeper steps.

In this embodiment, the radial pattern 81 composed of the multiple recesses 82 is illustrated. Nevertheless, the radial pattern 81 may be composed of any of protrusions and recesses. However, it is necessary to set the sizes and aspect ratio of the width and depth (step) of the pattern so as to allow a bonding material to enter. H/L is preferably 1 or more and 50 or less, where H represents the depth or height of the recesses or protrusions, and L represents the breadth.

Next, as shown in FIG. 24, a bonding layer 30 made of BCB is formed by spin coating on the bonding surface 80, which is the surface of the unevenness-forming layer 8 where the radial pattern 81 is formed.

Note that the thickness of the bonding layer 30 made of BCB can be for example 2.0 μm. Moreover, in this embodiment, BCB is exemplified as the bonding material of the bonding layer 30, but equivalent effect can also be obtained by using other thermosetting materials transparent to light, such as PI, sol-gel solutions, and low-dielectric glasses.

Meanwhile, besides the use of BCB as the bonding material, a metal bonding layer may be used as the bonding material.

Next, a silicon wafer is prepared as a support substrate (substrate to be bonded) 20.

Next, as shown in FIG. 25, the epitaxial wafer 200 having the BCB bonding layer 30 and the silicon wafer (support substrate) 20 are made to face with and be superposed on each other with the BCB bonding layer 30 sandwiched therebetween, and are subjected to thermocompression bonding.

Note that the BCB bonding material does not always have to be applied on the support substrate 20. Alternatively, the BCB bonding material may by applied only on the support substrate 20 without the application to the epitaxial wafer 200 side.

When BCB is employed as the bonding material, the thermocompression bonding is suitably performed within a range of 150 to 400° C. Moreover, the bonding is suitably performed with 50 to 500 N/cm² or more at the compression bonding portion.

These conditions are suitable conditions for obtaining sufficient bonding strength. The temperature may be lower or higher than this range. The bonding pressure may be lower or higher than this range.

After the bonding, the starting substrate (InP) 1 is removed with aqueous hydrochloric acid. After the starting substrate 1 is removed, the n⁺-InGaAs etching stop layer 2a is removed with phosphoric acid-hydrogen peroxide. Then, the n⁺-InP etching stop layer 2b is removed with aqueous hydrochloric acid to expose the n⁺-InGaAs layer 12. Thereby, a bonded semiconductor device 100 according to the third embodiment of the present invention shown in FIG. 26 is obtained, in which the epitaxial layer 10 is bonded to the support substrate 20 with the bonding layer 30 interposed therebetween.

Next, by a photolithography method, a resist pattern having an opening at a portion corresponding to a gate region is formed on the n⁺-InGaAs layer 12 side of the epitaxial layer 10. Using this resist pattern as a mask, portions of layers from the n⁺-InGaAs layer 12 to the i-InAlAs layer 14 corresponding to the opening of the resist pattern are removed with phosphoric acid-hydrogen peroxide. Since phosphoric acid-hydrogen peroxide has etching selectivity with respect to InP, a portion of the InP layer 15 is removed with aqueous hydrochloric acid to expose the i-InAlAs layer 16a, which is the layer below the InP layer 15. Thereafter, the resist is stripped.

Next, 100 nm of a SiNₓ (0<x≤2) layer 18 is deposited on the gate region and a surrounding portion thereof on the n⁺-InGaAs layer 12. Then, a resist pattern having openings of a drain region, a source region, and the gate region is formed by a photolithography method. After patterning with a hydrofluoric acid-containing solution, the resist is stripped. More specifically, a desired pattern 300 shown in FIG. 27 is formed by photolithography. After vapor-deposition of electrode materials, a source electrode 44, a drain electrode 45, and a gate electrode 43 as shown in FIG. 28 are formed at once by lift-off. As exemplary electrode structures, for example 0.1 μm of a Pt layer, for example 0.1 μm of a Ti layer, and for example 1.0 μm of a Au layer can be stacked.

As described above, the bonded semiconductor device 100 is obtained, which includes a gate region 101, a source region 102 and a drain region 103, and in which the epitaxial layer has a HEMT structure.

EXAMPLE

Hereinafter, the present invention will be specifically described by way of Examples and Comparative Examples, but the present invention is not limited thereto.

Example 1

In Example 1, a bonded semiconductor device having the same structure as the structure shown in FIG. 11 was prepared by the following procedure.

First, the PV epitaxial wafer 200 was provided as in the structure shown in FIG. 5, in which the etch stop layer 2 was disposed between the p-type GaAs starting substrate 1 and the epitaxial layer 10, and the epitaxial layer 10 had a PV (Photovoltaic) structure.

The PV epitaxial wafer 200 was provided by sequentially forming, on the p-type GaAs starting substrate 1: the p-In-GaP etch stop layer 2 having a film thickness of 0.2 μm; the p-GaAs contact layer 3 having a film thickness of 0.1 μm; the p-InGaP window layer 4 having a film thickness of 0.1 μm; the p-GaAs emitter layer 5 having a film thickness of 0.5 μm; the n-GaAs base layer 6 having a film thickness of 3.5 μm; the p-InGaP BSF layer 7 having a film thickness of 0.1 um; and the GaAs unevenness-forming layer 8.

Next, along a device-planned area and size, the same radial pattern as shown in FIG. 4 (A) was formed by a photolithography method on the GaAs unevenness-forming layer 8 located at the top surface of the epitaxial wafer 200. Based on the formed pattern, the radial pattern 81 composed of the recesses 82 was formed by dry etching (FIG. 6). As shown in FIG. 4 (A), the radial pattern 81 thus formed was a pattern in which the center 83 of the radial pattern was located at a position offset from the device-planned area.

In Example 1, the recesses 82 had a depth of 0.01 μm. Note that the breadth had the same value as the depth.

Next, as shown in FIG. 7, the bonding-metal film 31 was formed on the bonding surface 80, which is the surface of the unevenness-forming layer 8 where the radial pattern 81 was formed. As the bonding-metal film 31, a metal layer made of Ti/Au was formed. The Ti layer was 0.1 μm thick, and the Au layer was 1.0 μm.

Next, a silicon wafer was provided as the support substrate (substrate to be bonded) 20. As shown in FIG. 8, the bonding metal layer 32 made of Ti/Au was formed on the top surface of this the support substrate 20. The Ti layer was 0.1 μm thick, and the Au layer was 1.0 μm.

Next, as shown in FIG. 9, the epitaxial wafer 200 having the bonding-metal film 31 and the support substrate 20 having the bonding-metal film 32 were bonded by making the bonding-metal films 31 and 32 to face each other and thermocompression-bonding them each other at a temperature of 350° C. and a pressure of 300 N/cm².

After the bonding, the starting substrate 1 (GaAs) was removed with ammonia hydrogen peroxide-based etchant. After the starting substrate 1 was removed, the p-InGaP etching stop layer 2 was removed with hydrochloric acid-based etchant, and the p-GaAs contact layer 3 was exposed as shown in FIG. 10. Thereby, the bonded semiconductor device 100 shown in FIG. 10 was obtained, in which the epitaxial layer 10 was bonded to the support substrate 20 with the bonding layer 30 interposed therebetween, and the bonding layer 30 was constituted of the bonding-metal films 31 and 32.

Next, as shown in FIG. 11, the electrode 40 for current conduction was formed on the p-GaAs contact layer 3.

As shown in FIG. 12, the electrode 40 was configured to have the semi-circular electrode 41 disposed for bonding pad, and the branched electrodes 42 for current extraction extending from the electrode 41 for bonding pad.

In the electrode 40, a Zn-doped Au layer, a Ti layer, and a Au layer were sequentially arranged in this order starting from the layer adjacent to the p-GaAs contact layer 3. The Zn-doped Au layer was 0.1 μm thick, the Ti layer was 0.1 μm, and the Au layer was 2.0 μm.

As described above, the bonded semiconductor device 100 having the same structure as shown in FIG. 11 was obtained.

Examples 2 to 11

In Examples 2 to 11, bonded semiconductor devices 100 each having the same structure as shown in FIG. 11 were obtained by the same procedure as in Example 1, except that the depth of the recesses of the radial pattern 81 was changed to 0.02 μm (Example 2), 0.05 μm (Example 3), 0.1 μm (Example 4), 0.2 μm (Example 5), 0.5 μm (Example 6), 1.0 μm (Example 7), 2.0 μm (Example 8), 5.0 μm (Example 9), 6.0 μm (Example 10), and 10 μm (Example 11).
(Evaluation)

Chips were prepared by dicing the bonded semiconductor devices 100 obtained in Examples 1 to 11, and each was wired to an electrode and packaged while an encapsulation material was injected. The injection was performed while heat was applied to a temperature of the softening point or higher in order to soften the encapsulation material. Further, after the injection, the temperature of the encapsulation material was lowered to room temperature, followed by the packaging. FIG. 29 shows the relation between the depth of the recesses 81 and the chip cracking percentage in this event.

Example 12

Chips were prepared as in Example 1, except that a radial pattern composed of multiple protrusions having a height of 1 μm was formed as the radial pattern 81. The chips were packaged as in Example 1. in Example 12, no chip cracking occurred.

Comparative Example 1

Chips were prepared as in Example 1, except that the radial pattern 81 was not formed. The chips were packaged as in Example 1. In Comparative Example 1, chip cracking occurred by 35%.

As apparent from these results and the result shown in FIG. 29, in Examples 1 to 12, in each of which a radial pattern was formed on the bonding surface, occurrence of delamination and breakage due to temperature increase and decrease was more successfully suppressed than in Comparative Example 1, in which no radial pattern was formed on the bonding surface. Particularly, it can be seen that when the depth of the recesses was 0.02 μm to 5 μm, the results were excellent. Moreover, the comparison between Examples 7 and 12 reveals that occurrence of delamination and breakage due to temperature increase and decrease was successfully suppressed similarly regardless of whether the radial pattern was composed of recesses or protrusions.

Example 13

In Example 13, a bonded semiconductor device having the same structure as the structure shown in FIG. 20 was prepared by the following procedure.

First, the same LED epitaxial wafer 200 as shown in FIG. 13 was provided, in which the etch stop layer 2 was disposed between the p-type GaAs starting substrate 1 and the epitaxial layer 10, and the epitaxial layer 10 had an LED structure.

As shown in FIG. 13, the LED epitaxial wafer 200 was provided by sequentially forming, on the p-type GaAs substrate 1: the p-InGaP etch stop layer 2; the p-GaAs contact layer 3; the p-AlGaInP cladding layer 9; the i-AlGaInP active layer 5; the n-AlGaInP cladding layer 9; the n-InGaP middle layer 11; and the n-GaP window layer-cum-unevenness-forming layer 4a.

Next, along a device-planned area and size, a radial pattern was formed by a photolithography method on the GaP window layer-cum-unevenness-forming layer 4a located at the top surface of the epitaxial wafer 200. Based on the formed radial pattern, the radial pattern 81 composed of the recesses 82 having a depth of 1 μm and a breadth of 1 μm was formed as shown in FIG. 14 by dry etching with chlorine-based plasma. The obtained radial pattern 81 was the same pattern as shown in FIG. 4 (E).

Next, as shown in FIG. 15, the bonding layer 30 made of BCB having a thickness of 2.0 μm was formed by spin coating on the bonding surface 80, which is the surface of the window layer-cum-unevenness-forming layer 4a where the radial pattern 81 was formed.

Next, a sapphire substrate was provided as the support substrate (substrate to be bonded) 20. As shown in FIG. 16, the epitaxial wafer 200 having the BCB bonding layer 30 and the support substrate 20 were made to face with and be superposed on each other with the BCB bonding layer 30 sandwiched therebetween, and bonded by thermocompression bonding at a temperature of 350° C. and a pressure of 300 N/cm².

After the bonding, the starting substrate (GaAs) 1 was removed with ammonia hydrogen peroxide-based etchant. After the starting substrate 1 was removed, the p-InGaP etching stop layer 2 was removed with hydrochloric acid-based etchant to expose the p-GaAs contact layer 3. Thereby, the bonded semiconductor device 100 shown in FIG. 17 was obtained, in which the epitaxial layer 10 was bonded to the support substrate 20 with the bonding layer 30 interposed therebetween.

Next, as shown in FIG. 18, the upper electrode 40 for current conduction was formed on the p-GaAs contact layer 3 and the region of the p-GaAs contact layer 3 except for a region covered with the electrode 40 was removed with a sulfuric acid-hydrogen peroxide mixture or the like.

As shown in FIG. 21, the upper electrode 40 was configured to have the circular electrode 41 disposed for bonding pad, and the branched electrodes 42 for current extraction extending from the electrode 41 for bonding pad.

Next, a part of the epitaxial layer 10 outside the region where the electrode 40 was formed was partially cut away, and a portion of the n-GaP window layer-cum-unevenness-forming layer 4a was exposed as shown in FIG. 19.

Next, as shown in FIG. 20, the lower electrode 50 was formed on a section of the exposed n-GaP window layer-cum-unevenness-forming layer 4a.

In the upper electrode 40, a Zn-doped Au layer, a Ti layer, and a Au layer were sequentially arranged in this order starting from the layer adjacent to the p-GaAs contact layer 3. The Zn-doped Au layer was 0.1 μm thick, the Ti layer was 0.1 μm, and the Au layer was 2.0 μm.

In the lower electrode 50, a Ge-doped Au layer, a Ni layer, a Ti layer, and a Au layer were sequentially arranged in this order starting from the layer adjacent to the n-GaP window layer-cum-unevenness-forming layer 4a. The Ge-doped Au layer was 0.1 μm thick, the Ni layer was 0.1 μm, the Ti layer was 0.1 μm, and the Au layer was 2.0 μm.

As described above, the bonded semiconductor device 100 having the same structure as shown in FIG. 20 was obtained.

(Evaluation)

Chips were prepared by dicing the bonded semiconductor device 100 obtained in Example 13, and each was wired to an electrode and packaged while an encapsulation material was injected. The injection was performed while heat was applied to a temperature of the softening point or higher in order to soften the encapsulation material. Further, after the injection, the temperature of the encapsulation material was lowered to room temperature, followed by the packaging. Then, as a result of examining chip cracking, no chip cracking occurred.

Example 14

Chips were prepared as in Example 13, except that a radial pattern composed of multiple protrusions having a height of 1 μm was formed as the radial pattern 81. The chips were packaged as in Example 13. In Example 14, no chip cracking occurred.

Comparative Example 2

Chips were prepared as in Example 13, except that the radial pattern 81 was not formed. The chips were packaged as in Example 13. In Comparative Example 2, chip cracking occurred by 30%.

As apparent from the above results, in Examples 13 and 14, in each of which a radial pattern was formed on the bonding surface, occurrence of delamination and breakage due to temperature increase and decrease was more successfully suppressed than in Comparative Example 2, in which no radial pattern was formed on the bonding surface. Moreover, the comparison between Examples 13 and 14 reveals that occurrence of delamination and breakage due to temperature increase and decrease was successfully suppressed similarly regardless of whether the radial pattern was composed of recesses or protrusions.

Example 15

In Example 15, a bonded semiconductor device having the same structure as the structure shown in FIG. 28 was prepared by the following procedure.

First, the same HEMT epitaxial wafer 200 as shown in FIG. 22 was provided, in which the etch stop layer 2 was disposed between the n-type InP starting substrate 1 and the epitaxial layer 10, and the epitaxial layer 10 had a HEMT structure.

As shown in FIG. 22, the HEMT epitaxial wafer 200 was provided by sequentially forming, on the n-type InP starting substrate 1: the etch stop layer 2 including the n⁺-InGaAs etch stop layer 2a and the n-InP etch stop layer 2b; the n⁺-InGaAs contact layer 12; the n⁺-InAlAs layer 13; the i-InAlAs layer 14; the i-InP etch stop layer 15; the i-InAlAs-containing layer 16 including the Si delta-doped layer 16b and the two i-InAlAs layers 16a sandwiching the layer 16b therebetween; the i-InGaAs layer 17; and the i-InAlAs unevenness-forming layer 8.

Next, along a device-planned area and size, the same radial pattern as shown in FIG. 2 was formed by a photolithography method on the i-InAlAs unevenness-forming layer 8 located at the top surface of the epitaxial wafer 200. Based on the formed pattern, the radial pattern 81 composed of the multiple recesses 82 having a depth of 1 μm and a breadth of 1 μm was formed as shown in FIG. 23 by dry etching with chlorine-based plasma. The obtained radial pattern 81 was the same pattern as shown in FIG. 2.

Next, as shown in FIG. 24, the bonding layer 30 made of BCB having a thickness of 2.0 μm was formed by spin coating on the bonding surface 80, which is the surface of the unevenness-forming layer 8 where the radial pattern 81 was formed.

Next, a silicon wafer was provided as the support substrate (substrate to be bonded). As shown in FIG. 25, the epitaxial wafer 200 having the BCB bonding layer 30 and the support substrate 20 were made to face each other and be superposed on each other with the BCB bonding layer 30 sandwiched therebetween and bonded by thermocompression bonding at a temperature of 350° C. and a pressure of 300 N/cm².

After the bonding, the starting substrate (InP) 1 was removed with aqueous hydrochloric acid. After the starting substrate 1 was removed, the n⁺-InGaAs etching stop layer 2a was removed with phosphoric acid-hydrogen peroxide. Then, the n$^+$-InP etching stop layer 2b was removed with aqueous hydrochloric acid to expose the n$^+$-InGaAs layer 12. Thereby, the bonded semiconductor device 100 shown in FIG. 26 was obtained, in which the epitaxial layer 10 was bonded to the support substrate 20 with the bonding layer 30 interposed therebetween.

Next, by a photolithography method, a resist pattern having an opening at a portion corresponding to a gate region was formed on the n$^+$-InGaAs layer 12 side of the epitaxial layer 10. Using this resist pattern as a mask, portions of the layers from the n$^+$-InGaAs layer 12 to the i-InAlAs layer 14 corresponding to the opening of the resist pattern were removed with phosphoric acid-hydrogen peroxide. Then, a portion of the InP layer 15 was removed with aqueous hydrochloric acid to expose the i-InAlAs layer 16a, which is the layer below the InP 15. Subsequently, the resist was stripped.

Next, 100 nm of the SiN$_x$ (0<x≤2) layer 18 was deposited on the gate region and a surrounding portion thereof on the n$^+$-InGaAs layer 12. Then, a resist pattern having openings of a drain region, a source region, and the gate region was formed by a photolithography method. After patterning with a hydrofluoric acid-containing solution, the resist was stripped. More specifically, the desired pattern 300 shown in FIG. 27 was formed by photolithography. After vapor-deposition of electrode materials, the source electrode 44, the drain electrode 45, and the gate electrode 43 as shown in FIG. 28 were formed at once by lift-off. As the electrode structures, a 0.1-μm Pt layer, a 0.1-μm Ti layer, and a 1.0-μm Au layer were stacked.

As described above, the bonded semiconductor device 100 shown in FIG. 28 was obtained, which included the gate region 101, the source region 102 and the drain region 103, and in which the epitaxial layer had a HEMT structure. (Evaluation)

Chips were prepared by dicing the bonded semiconductor device 100 obtained in Example 15, and each was wired to an electrode and packaged while an encapsulation material was injected. The injection was performed while heat was applied to a temperature of the softening point or higher in order to soften the encapsulation material. Further, after the injection, the temperature of the encapsulation material was lowered to room temperature, followed by the packaging. Then, as a result of examining chip cracking, no chip cracking occurred.

Example 16

Chips were prepared as in Example 15, except that a radial pattern composed of multiple protrusions having a height of 1 μm was formed as the radial pattern 81. The chips were packaged as in Example 15. In Example 16, no chip cracking occurred.

Comparative Example 3

Chips were prepared as in Example 15, except that the radial pattern 81 was not formed. The chips were packaged as in Example 15. In Comparative Example 3, chip cracking occurred by 30%.

As apparent from the above results, in Examples 15 and 16, in each of which a radial pattern was formed on the bonding surface, occurrence of delamination and breakage due to temperature increase and decrease was more success-fully suppressed than in Comparative Example 3, in which no radial pattern was formed on the bonding surface. Moreover, the comparison between Examples 15 and 16 reveals that occurrence of delamination and breakage due to temperature increase and decrease was successfully suppressed similarly regardless of whether the radial pattern was composed of recesses or protrusions.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A bonded semiconductor device comprising:
an epitaxial layer; and
a support substrate made of a material different from that of the epitaxial layer and bonded to the epitaxial layer via a bonding material,
wherein any one of a bonding surface of the epitaxial layer which is bonded to the support substrate via the bonding material and a bonding surface of the support substrate which is bonded to the epitaxial layer via the bonding material comprises a radial pattern including recesses or protrusions radially spreading from a certain point on the bonding surface as a center.

2. The bonded semiconductor device according to claim 1, wherein the recesses or the protrusions of the radial pattern have a depth or height H of 0.02 um or more and 5 μm or less.

3. The bonded semiconductor device according to claim 1, wherein the recesses or the protrusions of the radial pattern extend continuously or discretely in directions away from the center.

4. The bonded semiconductor device according to claim 2, wherein the recesses or the protrusions of the radial pattern extend continuously or discretely in directions away from the center.

5. The bonded semiconductor device according to claim 1, wherein the radial pattern is provided on the bonding surface of the epitaxial layer.

6. The bonded semiconductor device according to claim 2, wherein the radial pattern is provided on the bonding surface of the epitaxial layer.

7. The bonded semiconductor device according to claim 1, wherein
the support substrate comprises any material selected from the group consisting of AlN, Al$_2$O$_3$, Cu, GaAs, GaN, GaP, InP, Si, SiC, and SiO$_2$, and
the material of the support substrate has a crystal structure or amorphous structure.

8. The bonded semiconductor device according to claim 2, wherein
the support substrate comprises any material selected from the group consisting of AlN, Al$_2$O$_3$, Cu, GaAs, GaN, GaP, InP, Si, SiC, and SiO$_2$, and the material of the support substrate has a crystal structure or amorphous structure.

9. The bonded semiconductor device according to claim 1, wherein the bonding material is a metal film or thermosetting resin.

10. The bonded semiconductor device according to claim 2, wherein the bonding material is a metal film or thermosetting resin.

11. A method for manufacturing a bonded semiconductor device including an epitaxial layer, and a support substrate made of a material different from that of the epitaxial layer and bonded to the epitaxial layer via a bonding material, the method comprising:

providing a radial pattern including recesses or protrusions radially spreading from a certain point, as a center, on any one of a bonding surface of the epitaxial layer which is to be bonded to the support substrate and a bonding surface of the support substrate which is to be bonded to the epitaxial layer; and bonding the epitaxial layer to the support substrate such that the bonding surface of the epitaxial layer faces the bonding surface of the support substrate.

12. The method for manufacturing a bonded semiconductor device according to claim 11, wherein the radial pattern is provided such that the recesses or the protrusions have a depth or height H of 0.02 um or more and 5 μm or less.

13. The method for manufacturing a bonded semiconductor device according to claim 11, wherein the recesses or the protrusions are provided to extend continuously or discretely in directions away from the center.

14. The method for manufacturing a bonded semiconductor device according to claim 12, wherein the recesses or the protrusions are provided to extend continuously or discretely in directions away from the center.

15. The method for manufacturing a bonded semiconductor device according to claim 11, wherein the radial pattern is provided on the bonding surface of the epitaxial layer.

16. The method for manufacturing a bonded semiconductor device according to claim 12, wherein the radial pattern is provided on the bonding surface of the epitaxial layer.

17. The method for manufacturing a bonded semiconductor device according to claim 11, wherein a starting substrate of the epitaxial layer and the support substrate to be used each comprise any material selected from the group consisting of AlN, $Al_2O_3$, Cu, GaAs, GaN, GaP, InP, Si, SiC, and $SiO_2$, the material of the starting substrate of the epitaxial layer to be used has a crystal structure, and the material of the support substrate to be used has a crystal structure or amorphous structure.

18. The method for manufacturing a bonded semiconductor device according to claim 12, wherein a starting substrate of the epitaxial layer and the support substrate to be used each comprise any material selected from the group consisting of AlN, $Al_2O_3$, Cu, GaAs, GaN, GaP, InP, Si, SiC, and $SiO_2$, the material of the starting substrate of the epitaxial layer to be used has a crystal structure, and the material of the support substrate to be used has a crystal structure or amorphous structure.

19. The method for manufacturing a bonded semiconductor device according to claim 11, wherein the bonding material is a metal film or thermosetting resin.

20. The method for manufacturing a bonded semiconductor device according to claim 12, wherein the bonding material is a metal film or thermosetting resin.

\* \* \* \* \*